United States Patent
Terazawa et al.

(10) Patent No.: US 7,499,293 B2
(45) Date of Patent: Mar. 3, 2009

(54) HIGH VOLTAGE PULSE POWER CIRCUIT

(75) Inventors: Tatsuya Terazawa, Kasugai (JP); Takao Saito, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 5 days.

(21) Appl. No.: 11/683,552

(22) Filed: Mar. 8, 2007

(65) Prior Publication Data

US 2007/0210837 A1    Sep. 13, 2007

Related U.S. Application Data

(63) Continuation of application No. PCT/JP2006/305079, filed on Mar. 15, 2006.

(30) Foreign Application Priority Data

Jun. 29, 2005  (JP) .............................. 2005-189919

(51) Int. Cl.
*H02M 3/335* (2006.01)
*H02M 7/515* (2007.01)
*H02H 7/122* (2006.01)

(52) U.S. Cl. .................. 363/21.04; 363/21.1; 363/135; 363/57

(58) Field of Classification Search ............. 363/21.04, 363/21.09, 21.1, 135, 56.01, 57
See application file for complete search history.

(56) References Cited

U.S. PATENT DOCUMENTS

| | | | | |
|---|---|---|---|---|
| 4,128,793 A | * | 12/1978 | Stich | 318/808 |
| 4,257,092 A | * | 3/1981 | Prines et al. | 363/124 |
| 4,319,318 A | * | 3/1982 | Rippel et al. | 363/138 |
| 4,415,963 A | * | 11/1983 | Rippel et al. | 363/135 |
| 4,437,133 A | * | 3/1984 | Rueckert | 361/33 |
| 4,506,319 A | * | 3/1985 | Akamatsu | 363/138 |
| 5,086,205 A | | 2/1992 | Thommes | |
| 5,539,300 A | * | 7/1996 | Mathieu | 323/249 |
| 5,777,867 A | | 7/1998 | Hongu et al. | |

(Continued)

FOREIGN PATENT DOCUMENTS

EP   1 693 945 A1    8/2006

(Continued)

OTHER PUBLICATIONS

Ichikawa et al. "Deposition of a-Si: H based film by high voltage pulse discharge CVD," Applied Physics, vol. 61, No. 10, 1992, pp. 1039-1043 (w/ partial translation).

(Continued)

*Primary Examiner*—Bao Q Vu
(74) *Attorney, Agent, or Firm*—Burr & Brown

(57) ABSTRACT

A pulse power source comprises a first circuit, a second circuit, a transformer for coupling the first circuit and the second circuit, and a switching controller. The second circuit comprises a third semiconductor switch connected in series with a secondary winding of the transformer. The third semiconductor switch is connected in such a direction that a voltage generated in the second circuit is reverse-biased during a period in which the second semiconductor switch is turned on. A gate amplifier for forming a control signal from the switching controller into a pulse and outputting the pulse as a pulse signal is connected between a gate terminal and a cathode terminal of the third semiconductor switch.

15 Claims, 31 Drawing Sheets

U.S. PATENT DOCUMENTS

| | | | |
|---|---|---|---|
| 6,205,040 B1 * | 3/2001 | Teichmann | 363/57 |
| 6,438,004 B1 * | 8/2002 | Tanaka et al. | 363/56.02 |
| 6,788,012 B2 | 9/2004 | Sakuma et al. | |
| 7,084,528 B2 | 8/2006 | Hatano et al. | |

FOREIGN PATENT DOCUMENTS

| | | |
|---|---|---|
| JP | 04-224079 | 8/1992 |
| JP | 06-197534 | 7/1994 |
| JP | 2649340 | 5/1997 |
| JP | 09-172788 | 6/1997 |
| JP | 2002-359979 | 12/2002 |
| JP | 2004-072994 | 3/2004 |
| JP | 2006-025543 | 1/2006 |
| WO | 2005/041389 A1 | 5/2005 |

OTHER PUBLICATIONS

Namihara et al. "Improvement of $No_x$ Removal Efficiency Using Short-Width Pulsed Power," IEEE Transactions on Plasmic Science, vol. 28, No. 2, Apr. 2000, pp. 434-442.

* cited by examiner (MODE 1)

(MODE 1)

(MODE 1)

(MODE 5)

(MODE 6)

HIGH VOLTAGE PULSE POWER CIRCUIT

CROSS REFERENCE TO RELATED APPLICATION

This application is based upon and claims the benefit of priority from JP 2005-189919 filed Jun. 29, 2005, the entirety of which is incorporated herein by reference.

BACKGROUND OF THE INVENTION

1. Field of the Invention

The present invention relates to an electric circuit for supplying a sharply rising, large current with a low loss when a current is commutated from a first circuit to a second circuit, a pulse power source for generating a high-voltage pulse from the second circuit using the electric circuit, and a pulse power source for successively outputting pulses of positive polarity and pulses of negative polarity.

2. Description of the Related Art

In recent years, technologies for deodorization, sterilization, film growth, and toxic gas decomposition based on a plasma produced by discharging high-voltage pulses have been put to practical use (see, for example, Japanese Patent No. 2649340 and Applied Physics, Vol. 61, No. 10, 1992, pages 1039 through 1043, "Deposition of a—Si:H based film by high voltage pulse discharge CVD"). It has been recognized that it is necessary to supply high-voltage pulses of very short pulse duration for efficient plasma processing (see, for example, IEEE TRANSACTION ON PLASMIC SCIENCE, Vol. 28, No. 2, April 2000, pages 434 through 442, "Improvement of NOx Removal Efficiency Using Short-Width Pulsed Power").

A pulse power source as disclosed in Japanese Laid-Open Patent Publication No. 2002-359979 has been proposed. As shown in FIG. 29 of the accompanying drawings, the proposed pulse power source 100 comprises an extremely simple circuit having a DC power supply 102, an inductor 104, a first semiconductor switch 106, and a second semiconductor switch 108 which are connected in series across the DC power supply 102, and a diode 110 having a cathode connected to an end of the inductor 104 whose other end is connected to the anode terminal of the first semiconductor switch 106, and an anode connected to the gate terminal of the first semiconductor switch 106.

When the second semiconductor switch 108 is turned on, the first semiconductor switch 106 becomes conductive, applying the voltage from the DC power supply 102 to the inductor 104 to store induced energy in the inductor 104. When the second semiconductor switch 108 is thereafter turned off, the first semiconductor switch 106 is quickly turned off, developing a sharply rising extremely narrow high-voltage pulse Po across the inductor 104. Therefore, the high-voltage pulse Po appears between output terminals 112, 114 of the inductor 104.

The pulse power source 100 is of a simple circuit arrangement which is capable of supplying the high-voltage pulse Po which has a sharply rising time and an extremely short pulse duration, without using a plurality of semiconductor switches to which a high voltage is applied.

It is hoped that the pulse power source shown in FIG. 29 will be able to supply the secondary side with a sharply rising, large current with a low loss.

With the pulse power source shown in FIG. 29, electrodes are connected respectively to the output terminals and are accommodated in a reactor for causing a plasma reaction. In a period for storing electromagnetic energy in the inductor (charging period), a voltage induced in the inductor (induced voltage) is applied to a load connected to the secondary side (e.g., electrodes in the reactor), tending to bring about an arc discharge in the reactor. When an arc discharge is produced, an overcurrent flows in a primary circuit of the inductor (main circuit), tending to adversely affect the various semiconductor switches.

A pulse power source used to generate a plasma by changing an electric field to accelerate electrons, employs a process of successively outputting pulses of opposite polarities, i.e., pulses of positive polarity and pulses of negative polarity, in order to generate a high potential difference with a low voltage.

As shown in FIG. 30 of the accompanying drawings, a conventional pulse power source 200 according to the above process has a DC power supply 202, a first switch 204 and a second switch 206 that are connected in series with each other across the DC power supply 202, a third switch 208 and a fourth switch 210 that are connected in series with each other across the DC power supply 202, and a transformer 214 having a primary winding 212 connected between a contact a1 between the first switch 204 and the second switch 206 and a contact a2 between the third switch 208 and the fourth switch 210. The conventional pulse power source 200 is of a bridge configuration. An output voltage Vout is produced across a secondary winding 216 of the transformer 214.

When the second switch 206 and the third switch 208 are turned on, a negative voltage is output across the secondary winding 216 as shown in FIG. 31 of the accompanying drawings. When the second switch 206 and the third switch 208 are turned off after a certain period of time, a negative pulse 218 is generated. When the first switch 204 and the fourth switch 210 are turned on, a positive voltage is output across the secondary winding 216. When the first switch 204 and the fourth switch 210 are turned off after a certain period of time, a negative pulse 220 is generated.

However, the conventional pulse power source 200 is disadvantageous in that the four switches 204, 206, 208, 210 need to be used to form a bridge, resulting in a large number of parts required. Therefore, the conventional pulse power source 200 is large in size and high in cost.

Furthermore, as described above, it is necessary to supply a sharply rising, large current to flow in the secondary side with a low loss and also not to apply an induced voltage to the electrodes in the reactor during a charging period.

Furthermore, depending on appropriate conditions of the application, it is necessary to be able to change the pulse duration of positive pulses and the pulse duration of negative pulses independently of each other.

SUMMARY OF THE INVENTION

In view of the above problem, it is an object of the present invention to provide an electric circuit for supplying a sharply rising, large current with a low loss when a current is commutated from a first circuit to a second circuit, and a pulse power source employing such an electric circuit.

Another object of the present invention to provide a pulse power source for preventing an induced voltage from being applied to a second circuit during a charging period in a first circuit, thereby providing increased operation reliability.

Still another object of the present invention to provide a pulse power source for successively outputting pulses of positive polarity and pulses of negative polarity and changing the pulse duration of positive pulses and the pulse duration of negative pulses independently of each other.

Yet another object of the present invention to provide a pulse power source for successively outputting pulses of positive polarity and pulses of negative polarity and supplying a sharply rising, large current to flow in a secondary side with a low loss.

Yet still another object of the present invention to provide a pulse power source for successively outputting pulses of positive polarity and pulses of negative polarity and preventing an induced voltage from being applied to the secondary side during a charging period in a primary side, thereby providing increased operation reliability.

An electric circuit according to the present invention has a first circuit having a first semiconductor switch, and a second circuit for commutating a current based on turn-off of the first semiconductor switch, the second circuit having a second semiconductor switch which is turned on while being reverse-biased during at least a final stage of a period in which the first semiconductor switch is turned on.

With this arrangement, when a current is commutated from the first circuit to the second circuit, a sharply rising, large current can flow with a low loss.

The second semiconductor switch may have a gate terminal, a cathode terminal, and an anode terminal, and the electric circuit may further have a control circuit for supplying at least an On signal between the gate terminal and the cathode terminal of the second semiconductor switch during at least the final stage of the period in which the first semiconductor switch is turned on.

Alternatively, the second semiconductor switch may have a gate terminal, a cathode terminal, and an anode terminal, and the electric circuit may further have a third circuit for supplying a current flowing in the first circuit as an On signal between the gate terminal and the cathode terminal of the second semiconductor switch.

A pulse power source according to the present invention has a first circuit having a first semiconductor switch and a power supply, and a second circuit for commutating a current based on turn-off of the first semiconductor switch and generating a high-voltage pulse, the second circuit having a second semiconductor switch which is turned on while being reverse-biased during at least a final stage of a period in which the first semiconductor switch is turned on.

With this arrangement, when a current is commutated from the first circuit to the second circuit, a sharply rising, large current can flow with a low loss.

The second semiconductor switch may have a gate terminal, a cathode terminal, and an anode terminal, and the pulse power source may further have a control circuit for supplying at least an On signal between the gate terminal and the cathode terminal of the second semiconductor switch during at least the final stage of the period in which the first semiconductor switch is turned on.

Alternatively, the second semiconductor switch may have a gate terminal, a cathode terminal, and an anode terminal, and the pulse power source may further have a third circuit for supplying a current flowing in the first circuit as an On signal between the gate terminal and the cathode terminal of the second semiconductor switch.

In the above arrangement, the first circuit and the second circuit may be coupled to each other by a transformer, the transformer having a primary winding connected to the first circuit, the transformer having a secondary winding connected to the second circuit, and the second semiconductor switch being connected in series with the secondary winding in such a direction that a voltage generated in the second circuit is reverse-biased during a period in which the first semiconductor switch is turned on.

During a charging period in the first circuit, an induced voltage is prevented from being applied to the second circuit, so that the pulse power source may be of increased reliability.

According to the present invention, there is also provided a pulse power source for storing a first induced energy in a first inductor, generating a first pulse when the first induced energy is released from the first inductor, storing a second induced energy in a second inductor, and generating a second pulse opposite to the first pulse when the second induced energy is released from the second inductor.

The pulse power source can successively generate positive pulses and negative pulses, with the pulse duration of the positive pulses and the pulse duration of the negative pulses being independently variable. As a result, it is possible for the pulse power source to generate pulses depending on appropriate conditions of various applications of a plasma process which is based on the discharge of high-voltage pulses, resulting in accelerating film growth and improving gas decomposition efficiency. The pulse power source is thus highly versatile.

According to specific structural details of the above pulse power source, the pulse power source may have a DC power supply, a rectifier connected between a contact between a primary winding of the first inductor and a primary winding of the second inductor, and the DC power supply, for supplying a current to the contact, a first switch circuit for controlling the current from the rectifier to flow from the contact to the first inductor, and a second switch circuit for controlling the current from the rectifier to flow from the contact to the second inductor.

In the above arrangement, the first switch circuit may have a first semiconductor switch connected between the first inductor and the DC power supply, for supplying a current from the DC power supply from the contact to the first inductor, a second semiconductor switch for controlling turn-on/off of the first semiconductor switch, a first control circuit for controlling turn-on/off of the second semiconductor switch, and the second switch circuit may have a third semiconductor switch connected between the second inductor and the DC power supply, for supplying a current from the DC power supply from the contact to the second inductor, a fourth semiconductor switch for controlling turn-on/off of the third semiconductor switch, and a second control circuit for controlling turn-on/off of the fourth semiconductor switch.

The pulse power source may further have a fifth semiconductor switch which is turned on while being in a zero-current state during at least a final stage of a period for storing the first induced energy in the first inductor, and a sixth semiconductor switch which is turned on while being in a zero-current state during at least a final stage of a period for storing the second induced energy in the second inductor. The pulse power source can successively generate positive pulses and negative pulses, and can supply a sharply rising, large current to a secondary side with a low loss.

Each of the fifth semiconductor switch and the sixth semiconductor switch may have a gate terminal, a cathode terminal, and an anode terminal, and the pulse power source may further have a third control circuit for supplying at least an On signal between the gate terminal and the cathode terminal of the fifth semiconductor switch during at least the final stage of the period for storing the first induced energy in the first inductor, and a fourth control circuit for supplying at least an On signal between the gate terminal and the cathode terminal of the sixth semiconductor switch during at least the final stage of the period for storing the second induced energy in the second inductor.

Alternatively, each of the fifth semiconductor switch and the sixth semiconductor switch may have a gate terminal, a cathode terminal, and an anode terminal, and the pulse power source may further have a first circuit for supplying a current flowing in the first inductor as an On signal between the gate terminal and the cathode terminal of the fifth semiconductor switch, and a second circuit for supplying a current flowing in the second inductor as an On signal between the gate terminal and the cathode terminal of the sixth semiconductor switch.

The pulse power source may further have a seventh semiconductor switch which is turned on while being reverse-biased by a voltage generated across a secondary winding of the first inductor during at least a final stage of a period for storing the first induced energy in the first inductor, and an eighth semiconductor switch which is turned on while being reverse-biased by a voltage generated across a secondary winding of the second inductor during at least a final stage of a period for storing the second induced energy in the second inductor. The pulse power source can successively generate positive pulses and negative pulses, and prevents an induced voltage from being applied to a load connected to a secondary side during a charging period in a primary side, so that the pulse power source is of increased reliability.

Each of the seventh semiconductor switch and the eighth semiconductor switch may have a gate terminal, a cathode terminal, and an anode terminal, and the pulse power source may further have a fifth control circuit for supplying an On signal between the gate terminal and the cathode terminal of the seventh semiconductor switch during at least the final stage of the period for storing the first induced energy in the first inductor, and a sixth control circuit for supplying an On signal between the gate terminal and the cathode terminal of the eighth semiconductor switch during at least the final stage of the period for storing the second induced energy in the second inductor.

Alternatively, each of the seventh semiconductor switch and the eighth semiconductor switch may have a gate terminal, a cathode terminal, and an anode terminal, and the pulse power source may further have a third circuit for supplying a current flowing in the primary winding of the first inductor as an On signal between the gate terminal and the cathode terminal of the seventh semiconductor switch, and a fourth circuit for supplying a current flowing in the primary winding of the second inductor as an On signal between the gate terminal and the cathode terminal of the eighth semiconductor switch.

As described above, the electric circuit according to the present invention is capable of supplying a sharply rising, large current with a low loss when a current is commutated from the first circuit to the second circuit.

The pulse power source according to the present invention is capable of supplying a sharply rising, large current with a low loss when a current is commutated from the first circuit to the second circuit.

The pulse power source according to the present invention prevents an induced voltage from being applied to the second circuit during a charging period in the first circuit, so that the pulse power source is of increased reliability.

The pulse power source according to the present invention is capable of successively generating positive pulses and negative pulses, with the pulse duration of the positive pulses and the pulse duration of the negative pulses being independently variable.

The pulse power source according to the present invention is capable of successively generating positive pulses and negative pulses and supplying a sharply rising, large current to a secondary side with a low loss.

The pulse power source according to the present invention is capable of successively generating positive pulses and negative pulses and preventing an induced voltage from being applied to a secondary side during a charging period in a primary side, so that the pulse power source is of increased reliability.

The above and other objects, features, and advantages of the present invention will become more apparent from the following description when taken in conjunction with the accompanying drawings in which preferred embodiments of the present invention are shown by way of illustrative example.

DETAIL DESCRIPTION OF THE INVENTION

Electric circuits and pulse power sources according to the present invention will be described below with reference to FIGS. 1 through 28 of the drawings.

Figure 1:
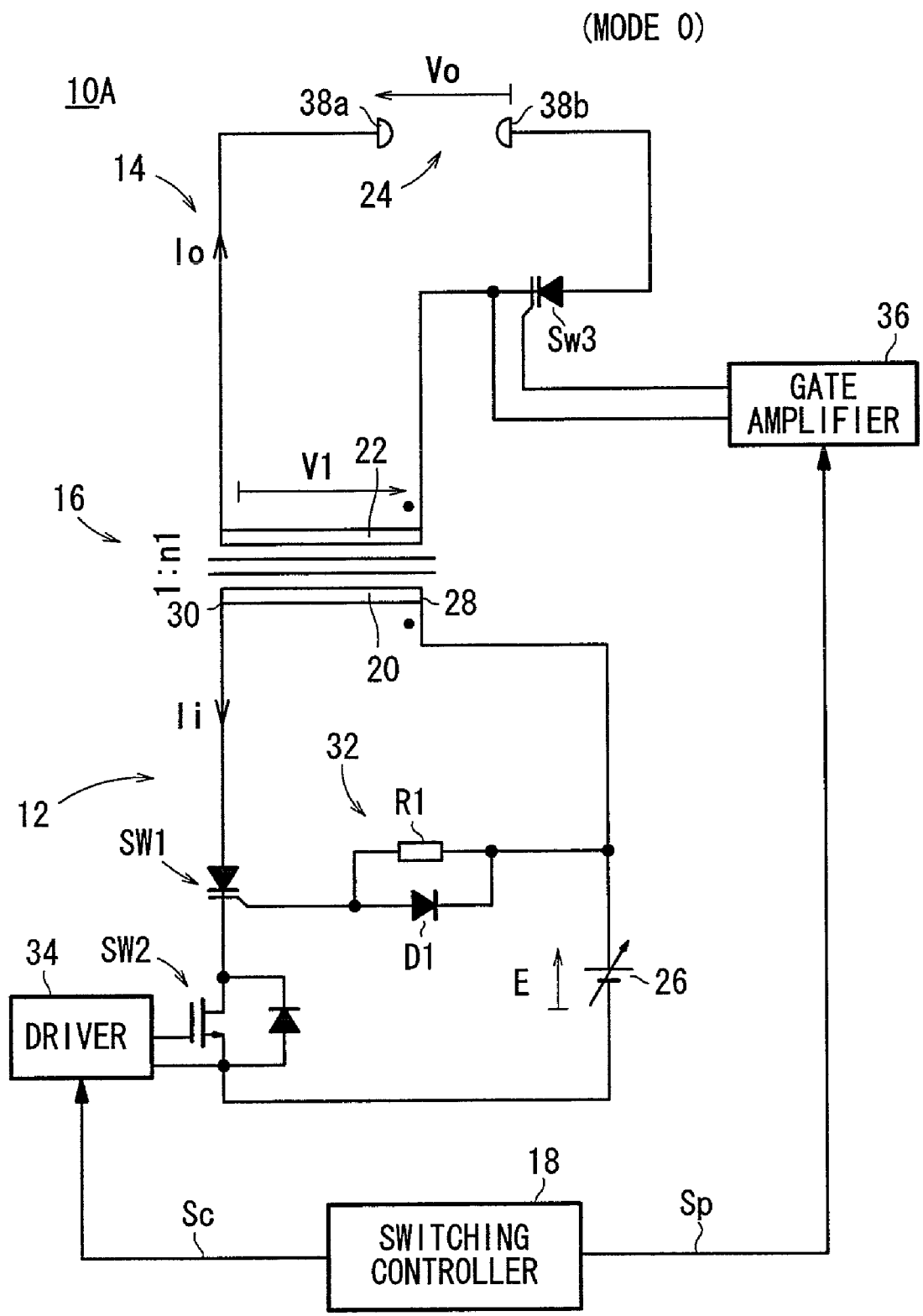
FIG. 1 is a circuit diagram of a pulse power source according to a first embodiment of the present invention, the pulse power source being in a mode 0 (initial state)

As shown in FIG. 1, a pulse power source 10A (hereinafter referred to as first pulse power source 10A) according to a first embodiment of the present invention has a first circuit 12, a second circuit 14, a transformer 16 coupling the first circuit 12 and the second circuit 14 to each other, and a switching controller 18. The transformer 16 has a primary winding 20 connected to the first circuit 12 and a secondary winding 22 connected to the second circuit 14. The first pulse power source 10A has its output power extracted from the opposite terminals of the secondary winding 22. A load 24 is connected between the terminals of the secondary winding 22. The load 24 may be a resistive load or a capacitive load (discharge gap or the like).

The first circuit 12 comprises a DC power supply (power supply voltage=E) 26, a first semiconductor switch SW1 connected between one of the terminals of the primary winding 20 and the negative terminal of the DC power supply 26, for supplying a current from the DC power supply 26 to the primary winding 20, and a second semiconductor switch SW2 for controlling the turn-on and turn-off of the first semiconductor switch SW1.

The first semiconductor switch SW1 may comprise a self-extinguishing or commutation-extinguishing device. In the first pulse power source 10A, the first semiconductor switch SW1 comprises an SI thyristor. However, the first semiconductor switch SW1 may comprise a bipolar transistor, a GTO, or the like.

A parallel-connected circuit 32 of a diode D1 and a first resistor R1 is connected between the gate terminal of the first semiconductor switch SW1 and the positive terminal of the DC power supply 26. The diode D1 has an anode terminal connected to the gate terminal of the first semiconductor switch SW1 and a cathode terminal connected to the positive terminal of the DC power supply 26.

The second semiconductor switch SW2 may comprise a self-extinguishing or commutation-extinguishing device. In the first pulse power source 10A, the second semiconductor switch SW2 comprises, for example, an n-channel power metal oxide semiconductor field-effect transistor incorporating an avalanche diode held in anti-parallel connection thereto.

The second semiconductor switch SW2 has a source terminal connected to the negative terminal of the DC power supply 26, a drain terminal connected to the cathode terminal of the first semiconductor switch SW1, and a gate terminal connected to a driver circuit 34 for amplifying a switching control signal Sc from the switching controller 18 and supplying the amplified switching control signal Sc to the gate terminal of the second semiconductor switch SW2.

The second circuit 14 has a third semiconductor switch SW3 connected in series with the secondary winding 22 of the transformer 16. The third semiconductor switch SW3 is connected in such a direction that a voltage generated in the second circuit 14 is reverse-biased during the period in which the second semiconductor switch SW2 is turned on.

The third semiconductor switch SW3 may comprise a self-extinguishing or commutation-extinguishing device. In the first pulse power source 10A, the third semiconductor switch S3 comprises an SI thyristor. However, the third semiconductor switch SW3 may comprise a bipolar transistor, a GTO, or the like.

A gate amplifier 36 for forming a control signal Sp from the switching controller 18 into a pulse and outputting the pulse as a pulse signal Pc is connected between the gate and cathode terminals of the third semiconductor switch SW3.

Circuit operation of the first pulse power source 10A, especially when the load 24 connected between the opposite terminals of the secondary winding 22 comprises a discharge gap having a pair of electrodes 38a, 38b, will be described below with reference to circuit diagrams shown in FIGS. 1 through 4 and a waveform diagram shown in FIG. 5.

It is assumed that the voltage produced by the DC power supply 26 is represented by E (V), the turn ratio of the transformer 16 (the number of turns of the primary winding 20/the number of turns of the secondary winding 22) is represented by 1/n1, and the primary inductance (exciting inductance) of the transformer 16 is represented by Lex.

In a mode 0 (initial state) of the first pulse power source 10A, all the switches are turned off, as shown in FIG. 1.

Figure 5:
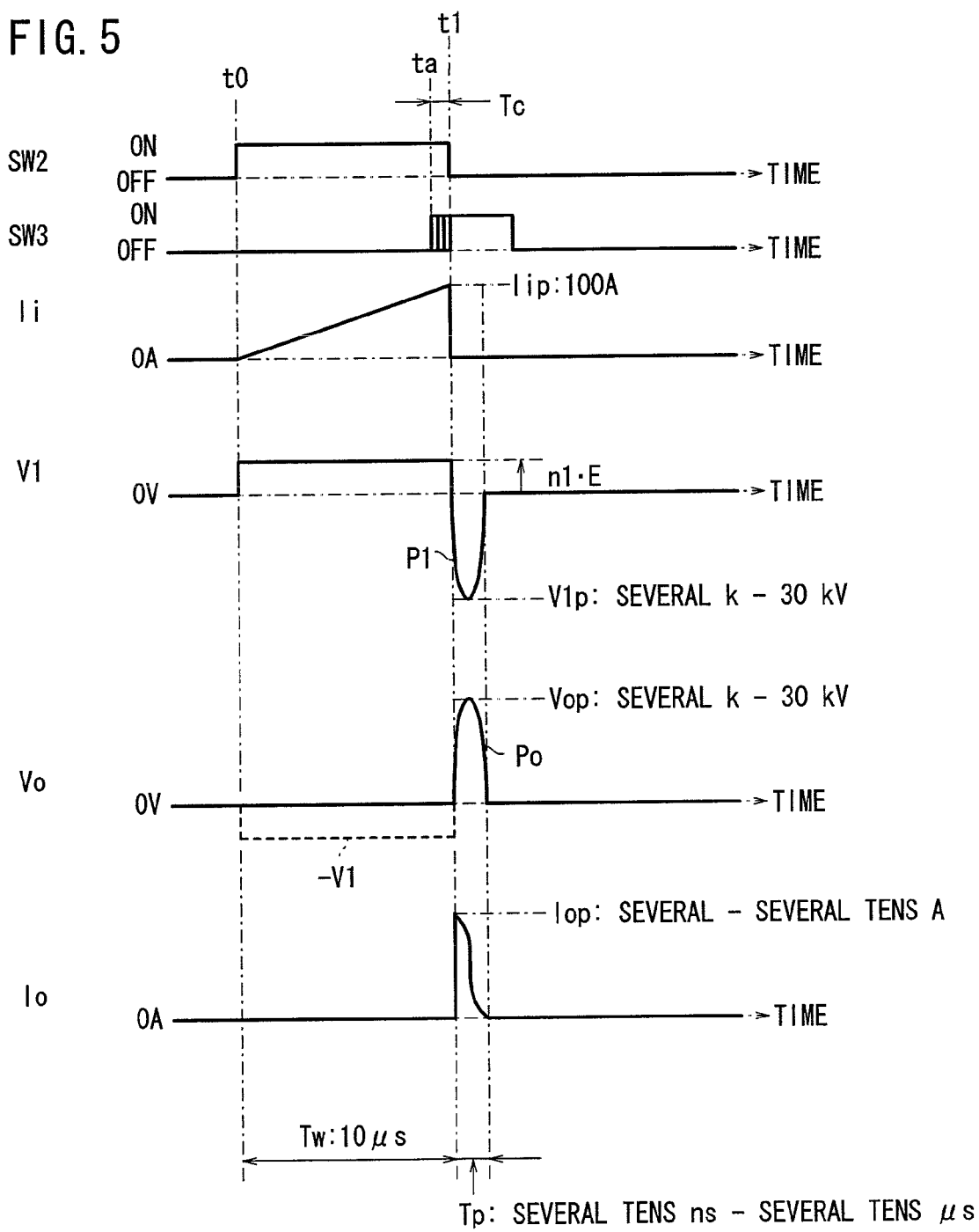
FIG. 5 is a diagram showing signal waveforms in circuit operation of the pulse power source according to the first embodiment.

Thereafter, at time t0 shown in FIG. 5, a high-level switching control signal Sc is supplied between the gate and source terminals of the second semiconductor switch SW2, turning on the second semiconductor switch SW2.

Figure 2:
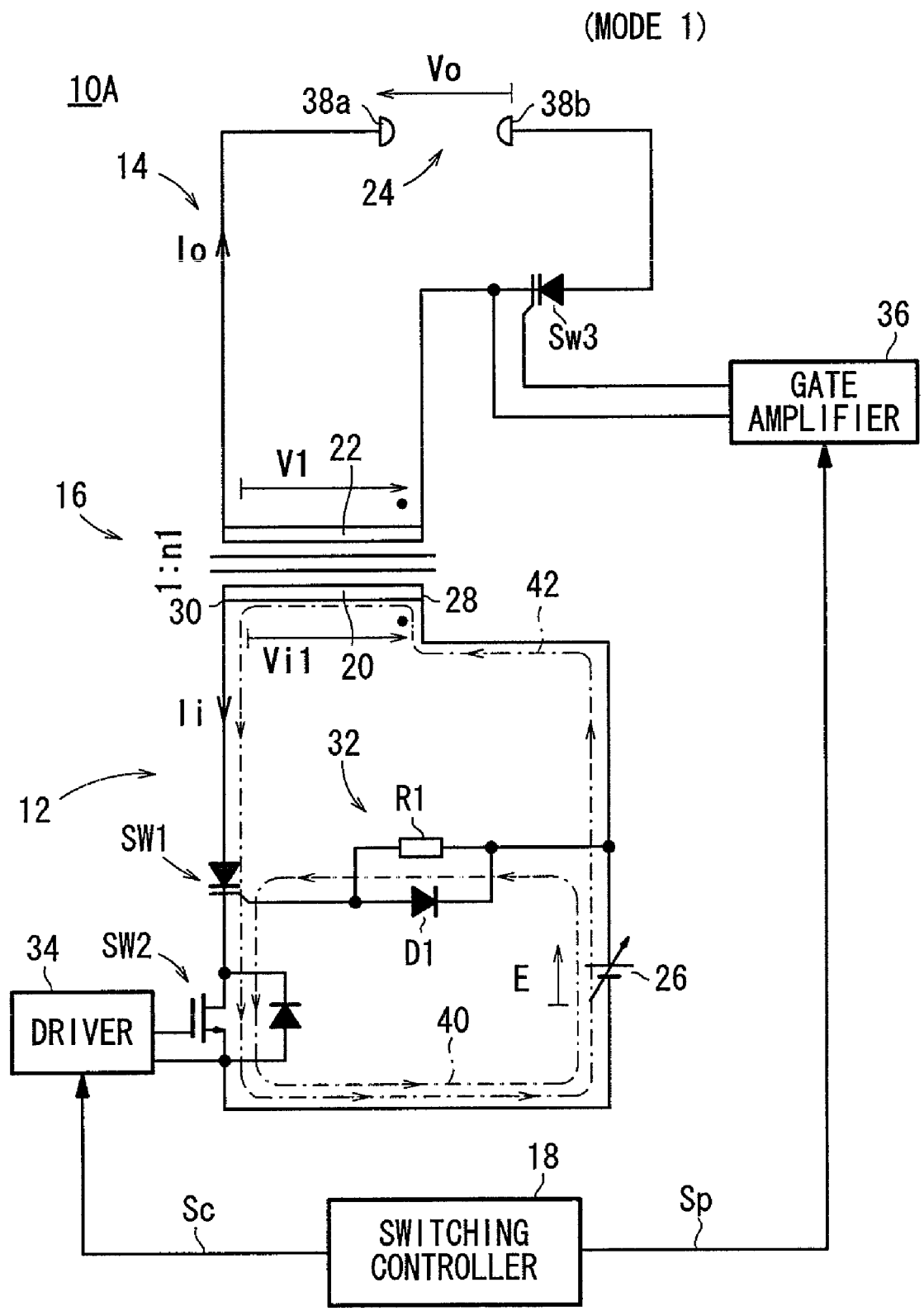
FIG. 2 is a circuit diagram of the pulse power source according to the first embodiment of the present invention, the pulse power source being in a mode 1 (charging period)

When the second semiconductor switch SW2 is turned on at time t0, the first pulse power source 10A enters a mode 1 (charging period). In the mode 1, as shown in FIG. 2, a current flows along a path 40 from the DC power supply 26 to the resistor R1 to the gate terminal of the first semiconductor switch SW1 to the cathode terminal of the first semiconductor switch SW1 to the second semiconductor switch SW2, turning on the first semiconductor switch SW1. Now, a voltage Vi1=+E (V) is applied across the primary winding 20 of the transformer 16, causing a current Ii to flow along a path 42 from the DC power supply 26 to the primary winding 20 to the first semiconductor switch SW1 to the second semiconductor switch SW2. The current Ii increases linearly with time in a positive direction at a gradient (E/Lex) (see FIG. 5), charging electromagnetic energy in the primary winding 20.

During a period Tw in which the second semiconductor switch SW2 is turned on, a constant positive voltage V1 is induced across the secondary winding 22. The voltage V1 induced across the secondary winding 22 has a level n1·E (V) (see FIG. 5).

In a final stage of the period Tw, the switching controller 18 controls the gate amplifier 36 to output a pulse signal Pc, causing a gate current to flow to the third semiconductor switch SW3 which is then turned on. The final stage of the period Tw may begin at time ta (see FIG. 5) just before a period Tc in which the third semiconductor switch SW3 is fully turned on by the gate current supplied thereto.

Since the third semiconductor switch SW3 is reverse-biased between the anode and cathode terminals thereof by the positive voltage (induced voltage) V1 induced across the secondary winding 22, no current flows in the second circuit 14. In other words, as a negative voltage (−V1: the voltage indicated by the broken line as the voltage Vo in FIG. 5) based on the induced voltage V1 is prevented from being applied to the electrodes 38a, 38b of the load 24 by the third semiconductor switch SW3, no arc discharge is caused in a reactor which houses the electrodes 38a, 38b therein.

The current Ii flowing through the primary winding 20 becomes Iip(=E·Tw/Lex) at time t1. When a desired level of electromagnetic energy(=Lex·Iip$^2$/2) is obtained, the switching controller 18 supplies a low-level switching control signal Sc to turn off the second semiconductor switch SW2 (see FIG. 5).

Figure 3:
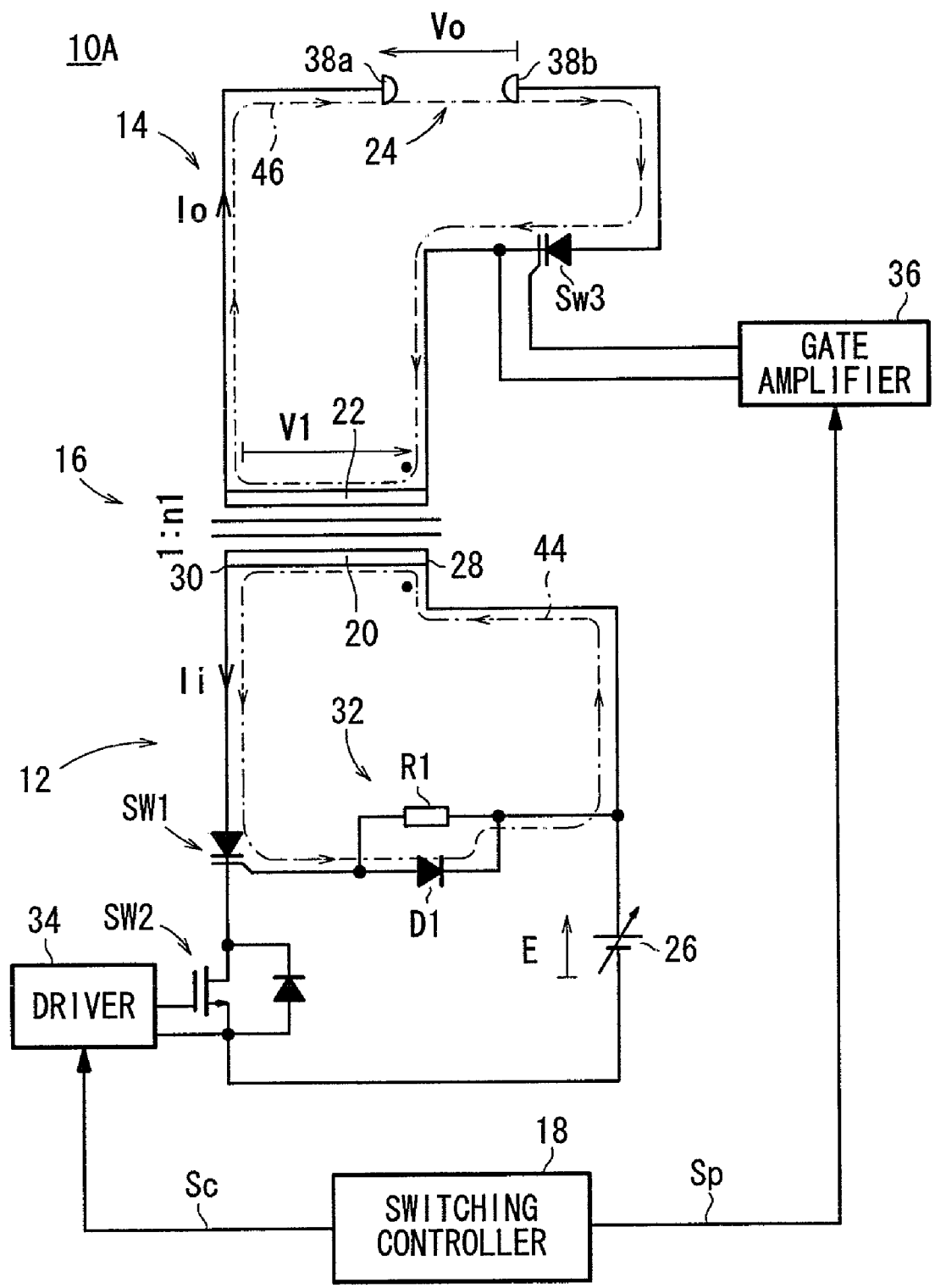
FIG. 3 is a circuit diagram of the pulse power source according to the first embodiment of the present invention, the pulse power source being in a mode 2 (commutation period)

When the second semiconductor switch SW2 is turned off at time t1, the first pulse power source 10A enters a mode 2 (commutation period). As shown in FIG. 3, a current flows in the first circuit 12 along a path 44 from the primary winding 20 to the first semiconductor switch SW1 to the diode D1, starting to turn off the first semiconductor switch SW1. At the same time, a current starts to flow in the second circuit 14 due to the electromagnetic energy charged in the primary winding 20 (see a path 46). At this time, since a sufficient gate current has flowed to the third semiconductor switch SW3 to turn on the third semiconductor switch SW3 before the second semiconductor switch SW2 is turned off, a sharply rising, large current Io flows with a low loss. Thereafter, the first semiconductor switch SW1 is completely turned off.

Figure 4:
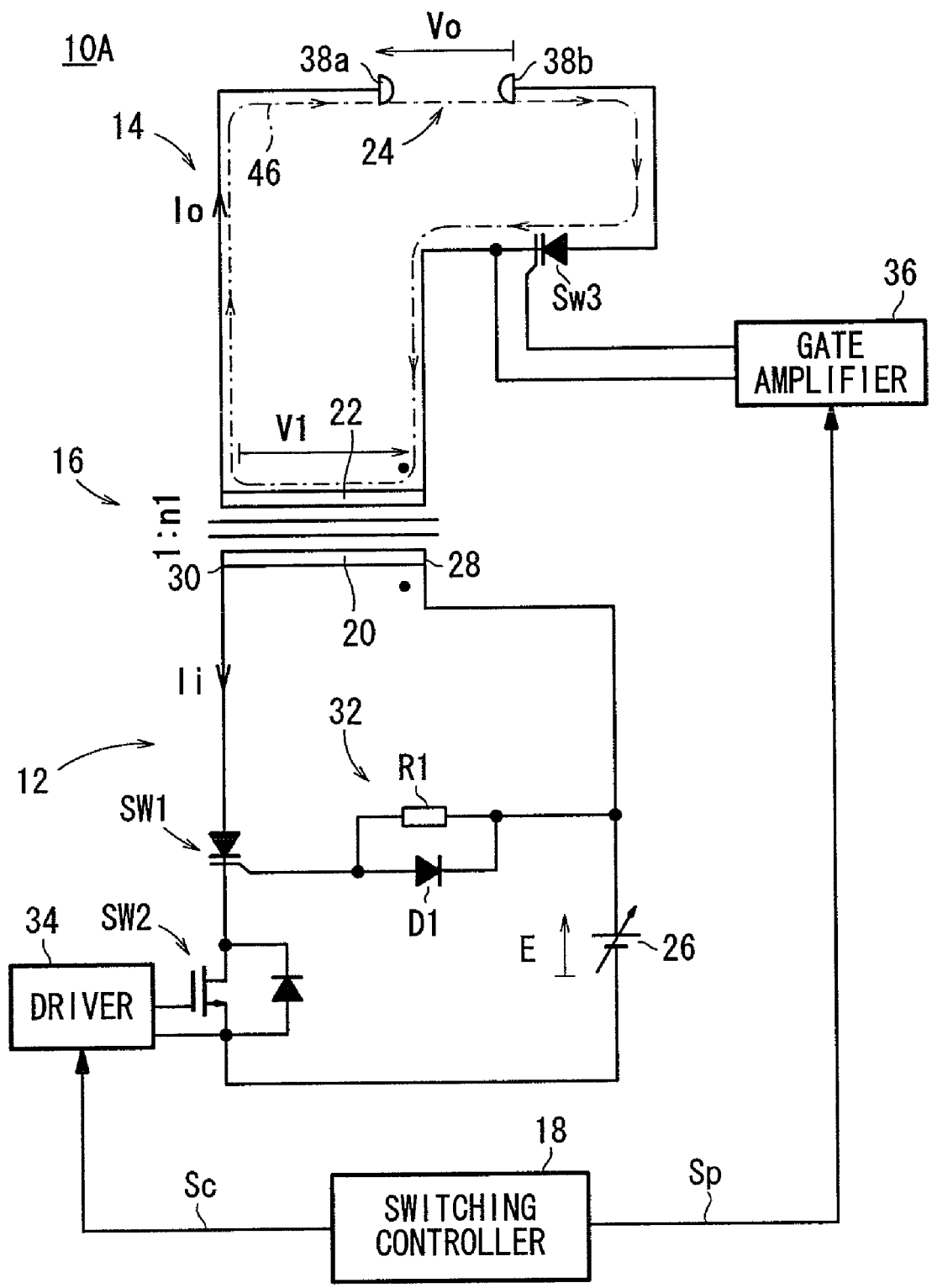
FIG. 4 is a circuit diagram of the pulse power source according to the first embodiment of the present invention, the pulse power source being in a mode 3 (discharging period)

When the first semiconductor switch SW1 is completely turned off, the first pulse power source 10A enters a mode 3 (discharging period). As shown in FIG. 4, because of resonance between the exciting inductance of the transformer 16 and the capacitance between the electrodes 38a, 38b of the load 24, the output voltage Vo between the electrodes 38a, 38b increases, outputting a positive pulse Po having a positive voltage value (Vop) as its peak value (discharge starting voltage) (see FIG. 5), thereby reducing the output current Io. The gradient of the rising edge of the positive pulse Po is determined by the resonant frequency between the exciting inductance (Lex) of the transformer 16 and the capacitance of the load 24.

A negative pulse P1 having a negative voltage value (V1p) as its peak value, which is of opposite polarity to the output voltage Vo, is induced across the secondary winding 22.

When the output voltage Vo reaches the discharge starting voltage Vop, the output voltage Vo quickly decreases. The output current Io decreases with a time constant determined by the characteristics of the load 24 during the discharge, and then the first pulse power source 10A enters the mode 0 (initial stage) shown in FIG. 1 again. The above sequence of operation is repeated for the first pulse power source 10A to output a succession of positive high-voltage pulses Po.

The positive pulse Po has a pulse duration Tp1 determined by the resonance between the exciting inductance and the capacitance between the electrodes 38a, 38b, and the characteristics of the load 24 during the discharge. Generally, the pulse duration Tp1 increases, as the resonant frequency is lower.

If the voltage E of the DC power supply 26 is 100 V, the exciting inductance Lex is 10 (μH), and the turn ratio of the transformer 16 is 1/(5 to 10), then the peak value Iip of the current Ii flowing through the primary winding 20 is about 100 (A), the peak value Vop of the output voltage Vo is in the range from several to 30 (kV), and the peak value Iop of the output current Io flowing in the second circuit 14 is in the range from several to several tens (A). The period of time in which the second semiconductor switch SW1 is turned on, i.e., a time period Tw from time t0 to time t1, is about 10 μsec.

With the first pulse power source 10A, as described above, the third semiconductor switch SW3 which is turned on in a reverse-biased state in at least the final stage of the time period Tw in which the second semiconductor switch SW2 is turned on, is connected to the second circuit 14. Therefore, when a current is commutated from the first circuit 12 to the second circuit 14, a sharply rising, large current Io flows with a low loss in the second circuit 14.

Furthermore, since the third semiconductor switch SW3 is connected in series with the secondary winding 22 of the transformer 16 in such a direction that the voltage V1 induced across the secondary winding 22 is reverse-biased during the period Tw in which the second semiconductor switch SW2 is turned on, the voltage V1 induced across the secondary winding 22 is not applied to the electrodes 38a, 38b during the charging period Tw in the first circuit 12. Therefore, the first pulse power source 10A is of increased reliability.

A pulse power source 10B (hereinafter referred to as "second pulse power source 10B") according to a second embodiment of the present invention will be described below with reference to FIGS. 6 through 10.

Figure 6:
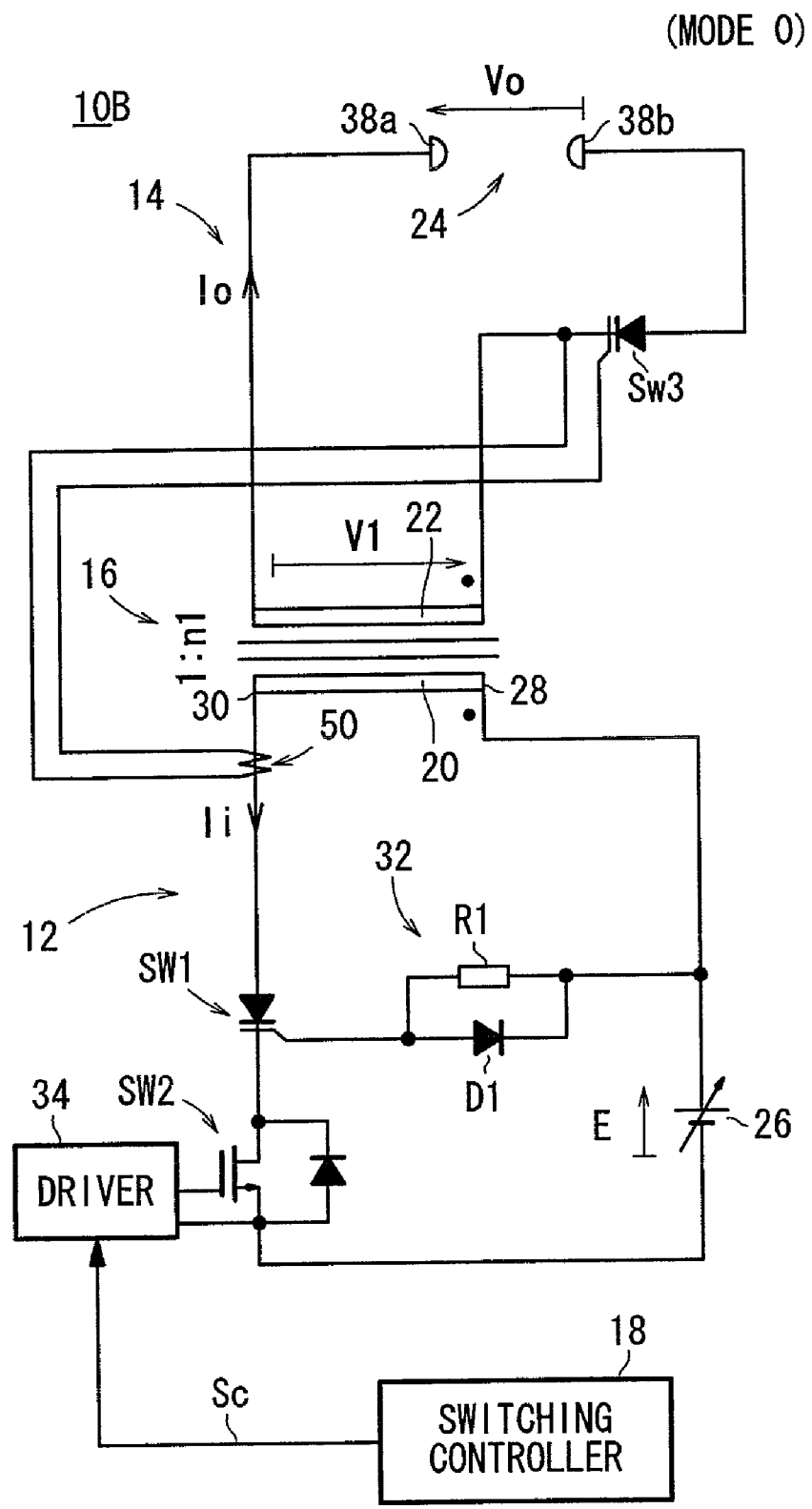
FIG. 6 is a circuit diagram of a pulse power source according to a second embodiment of the present invention, the pulse power source being in a mode 0 (initial state)

As shown in FIG. 6, the second pulse power source 10B is of essentially the same structure as the first pulse power source 10A. However, the second pulse power source 10B is different from the first pulse power source 10A in that a current transformer 50 is connected to the conductor of the first circuit 12 between the primary winding 20 of the transformer 16 and the anode terminal of the first semiconductor switch SW1, and the output terminals of the current transformer 50 are connected respectively to the gate and cathode terminals of the third semiconductor switch SW3.

Circuit operation of the second pulse power source 10B will be described below with reference to circuit diagrams shown in FIGS. 6 through 9 and a waveform diagram shown in FIG. 10.

In a mode 0 (initial state) of the second pulse power source 10B, all the switches are turned off, as shown in FIG. 6.

Figure 10:
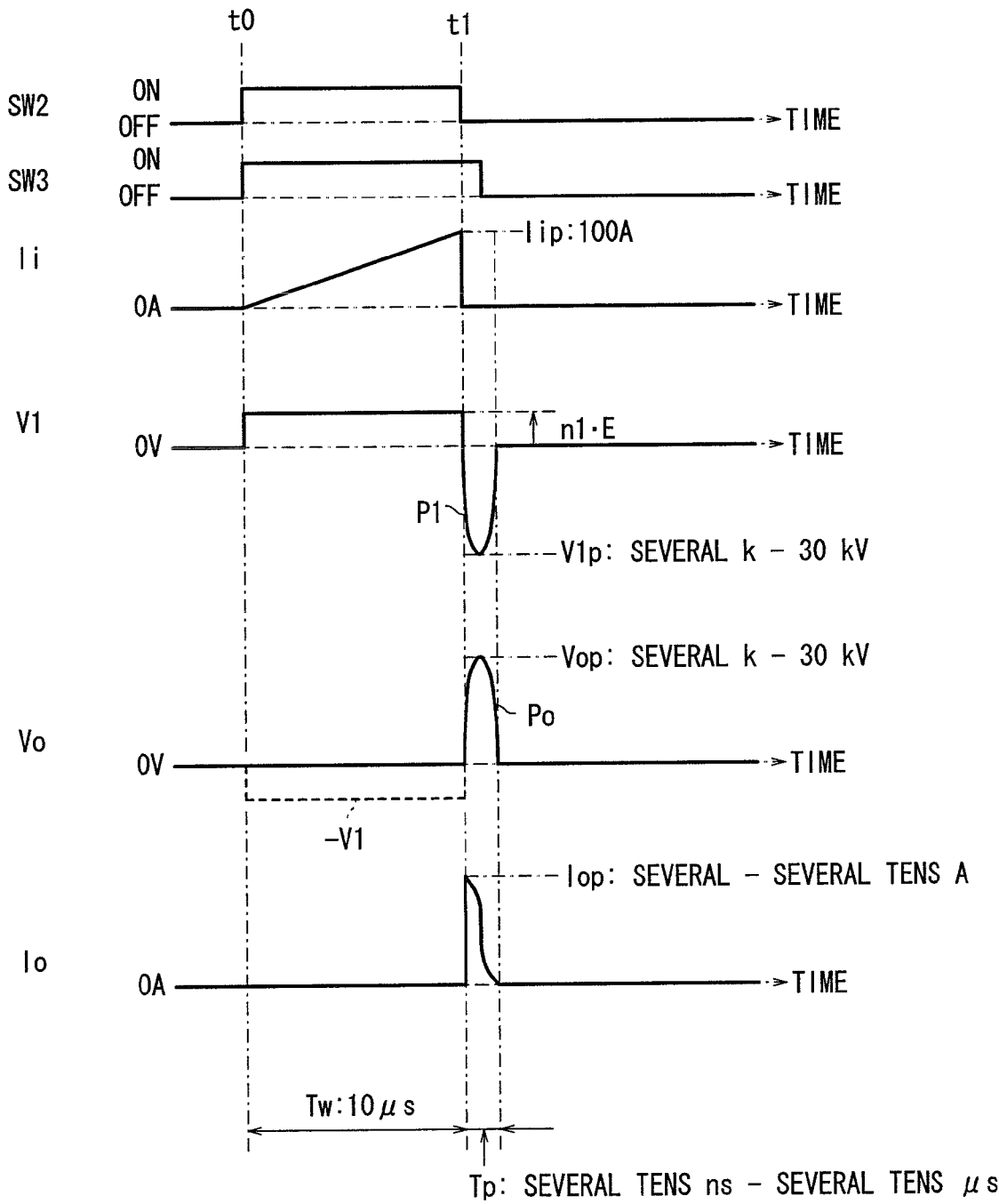
FIG. 10 is a diagram showing signal waveforms in circuit operation of the pulse power source according to the second embodiment.

Thereafter, at time t0 shown in FIG. 10, a high-level switching control signal Sc is supplied between the gate and source terminals of the second semiconductor switch SW2, turning on the second semiconductor switch SW2 (see FIG. 10).

Figure 7:
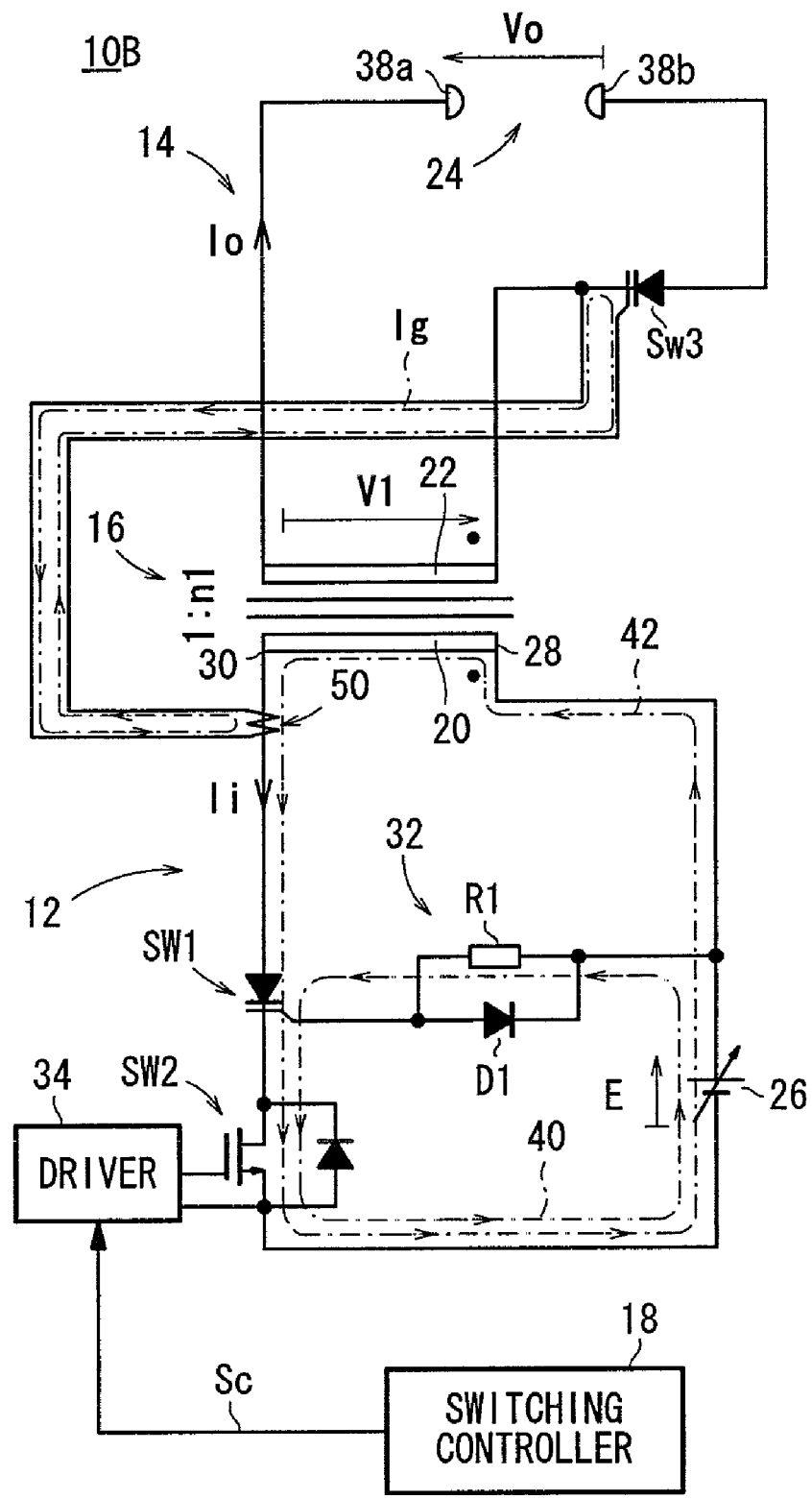
FIG. 7 is a circuit diagram of the pulse power source according to the second embodiment of the present invention, the pulse power source being in a mode 1 (charging period)

When the second semiconductor switch SW2 is turned on at time t0, the second pulse power source 10B enters a mode 1 (charging period). In the mode 1, as shown in FIG. 7, a current flows along a path 40 from the DC power supply 26 to the resistor R1 to the gate terminal of the first semiconductor switch SW1 to the cathode terminal of the first semiconductor switch SW1 to the second semiconductor switch SW2, turning on the first semiconductor switch SW1. Now, a voltage E (V) is applied across the primary winding 20 of the transformer 16, causing a current Ii to flow along a path 42 from the DC power supply 26 to the primary winding 20 to the first semiconductor switch SW1 to the second semiconductor switch SW2 thereby to charge electromagnetic energy in the primary winding 20. During a period Tw in which the second semiconductor switch SW2 is turned on, a constant positive voltage V1 is induced across the secondary winding 22.

When the current Ii flows, a gate current Ig flows from the current transformer 50 to the third semiconductor switch SW3, turning on the third semiconductor switch SW3. Since the third semiconductor switch SW3 is reverse-biased between the anode and cathode terminals thereof by the positive voltage V1 induced across the secondary winding 22, no current flows in the second circuit 14. In other words, as a negative voltage (−V1: the voltage indicated by the broken line as the voltage Vo in FIG. 10) based on the induced voltage V1 is prevented from being applied to the electrodes 38a, 38b of the load 24 by the third semiconductor switch SW3, no arc discharge is caused in the reactor which houses the electrodes 38a, 38b therein.

Figure 8:
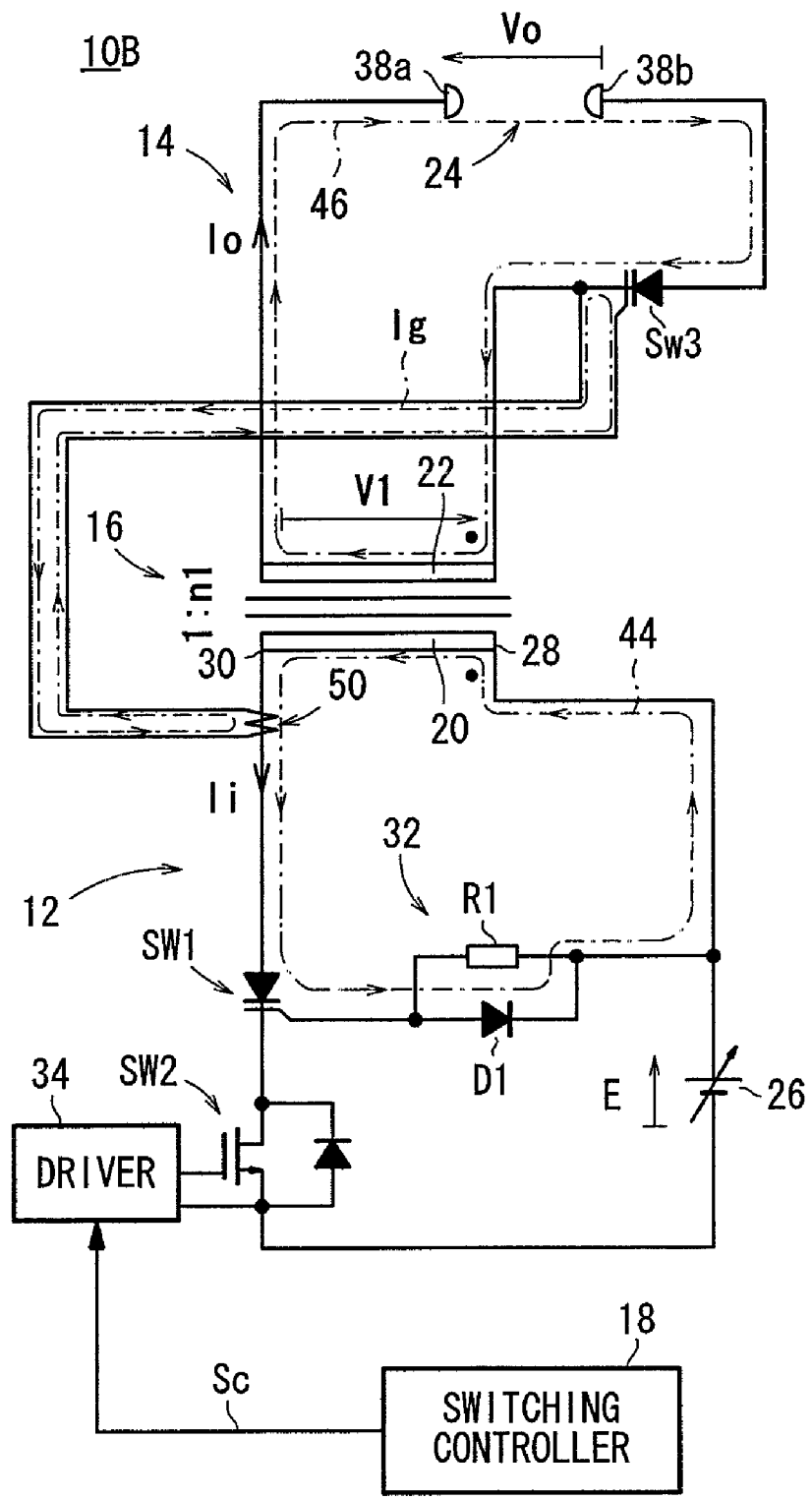
FIG. 8 is a circuit diagram of the pulse power source according to the second embodiment of the present invention, the pulse power source being in a mode 2 (commutation period)

When the second semiconductor switch SW2 is turned off at time t1, the second pulse power source 10B enters a mode 2 (commutation period). As shown in FIG. 8, a current flows in the first circuit 12 along a path 44 from the primary winding 20 to the first semiconductor switch SW1 to the diode D1, starting to turn off the first semiconductor switch SW1. At the same time, a current starts to flow in the second circuit 14 due to the electromagnetic energy stored in the primary winding 20 (see a path 46). At this time, since a sufficient gate current Ig has flowed to the third semiconductor switch SW3, a sharply rising, large current Io flows with a low loss in the second circuit 14. Thereafter, the first semiconductor switch SW1 is completely turned off.

Figure 9:
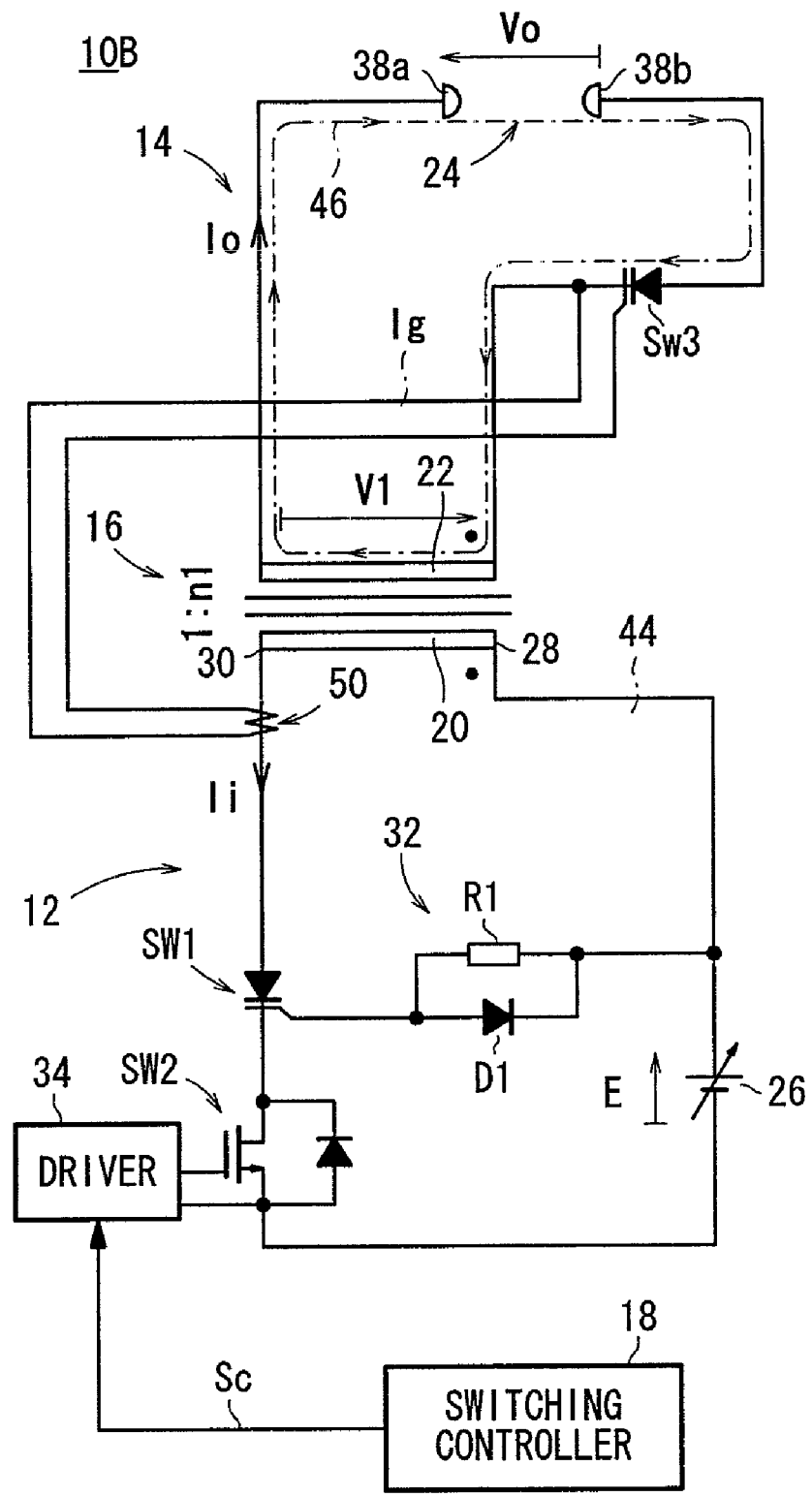
FIG. 9 is a circuit diagram of the pulse power source according to the second embodiment of the present invention, the pulse power source being in a mode 3 (discharging period)

When the first semiconductor switch SW1 is completely turned off, the second pulse power source 10B enters a mode 3 (discharging period). As shown in FIG. 9, because of resonance between the exciting inductance and the capacitance between the electrodes 38a, 38b, the output voltage Vo between the electrodes 38a, 38b increases, outputting a positive pulse Po having a positive voltage value (Vop) as its peak value (discharge starting voltage), thereby reducing the output current Io. The gradient of the rising edge of the positive pulse Po is determined by the resonant frequency between the exciting inductance (Lex) of the transformer 16 and the capacitance of the load 24.

When the output voltage Vo reaches the discharge starting voltage Vop, the output voltage Vo quickly decreases. The output current Io decreases with a time constant determined by the characteristics of the load 24 during the discharge, and the second pulse power source 10B enters the mode 0 (initial stage) shown in FIG. 6 again. The above sequence of operation is repeated to output a succession of positive high-voltage pulses Po.

The positive pulse Po has a pulse duration Tp1 determined by the resonance between the exciting inductance and the capacitance between the electrodes 38a, 38b, and the characteristics of the load 24 during the discharge. Generally, the pulse duration Tp1 increases, as the resonant frequency is lower.

With the second pulse power source 10B, as with the first pulse power source 10A, as described above, when a current is commutated from the first circuit 12 to the second circuit 14, a sharply rising, large current Io flows with a low loss in the second circuit 14. Furthermore, the voltage V1 induced across the secondary winding 22 is not applied to the electrodes 38a, 38b during the charging period Tw in the first circuit 12. Therefore, the second pulse power source 10B is of increased reliability.

Particularly, the second pulse power source 10B is simple in circuit arrangement, low in cost, and small in size because the turn-on of the third semiconductor switch SW3 can be controlled simply by connecting the current transformer 50 to the first circuit 12.

A pulse power source 10C (hereinafter referred to as "third pulse power source 10C") according to a third embodiment of the present invention will be described below with reference to FIGS. 11 through 19.

Unlike the first pulse power source 10A and the second pulse power source 10B, the third pulse power source 10C is capable of alternately and successively outputting pulses of positive polarity and pulses of negative polarity.

Figure 11:
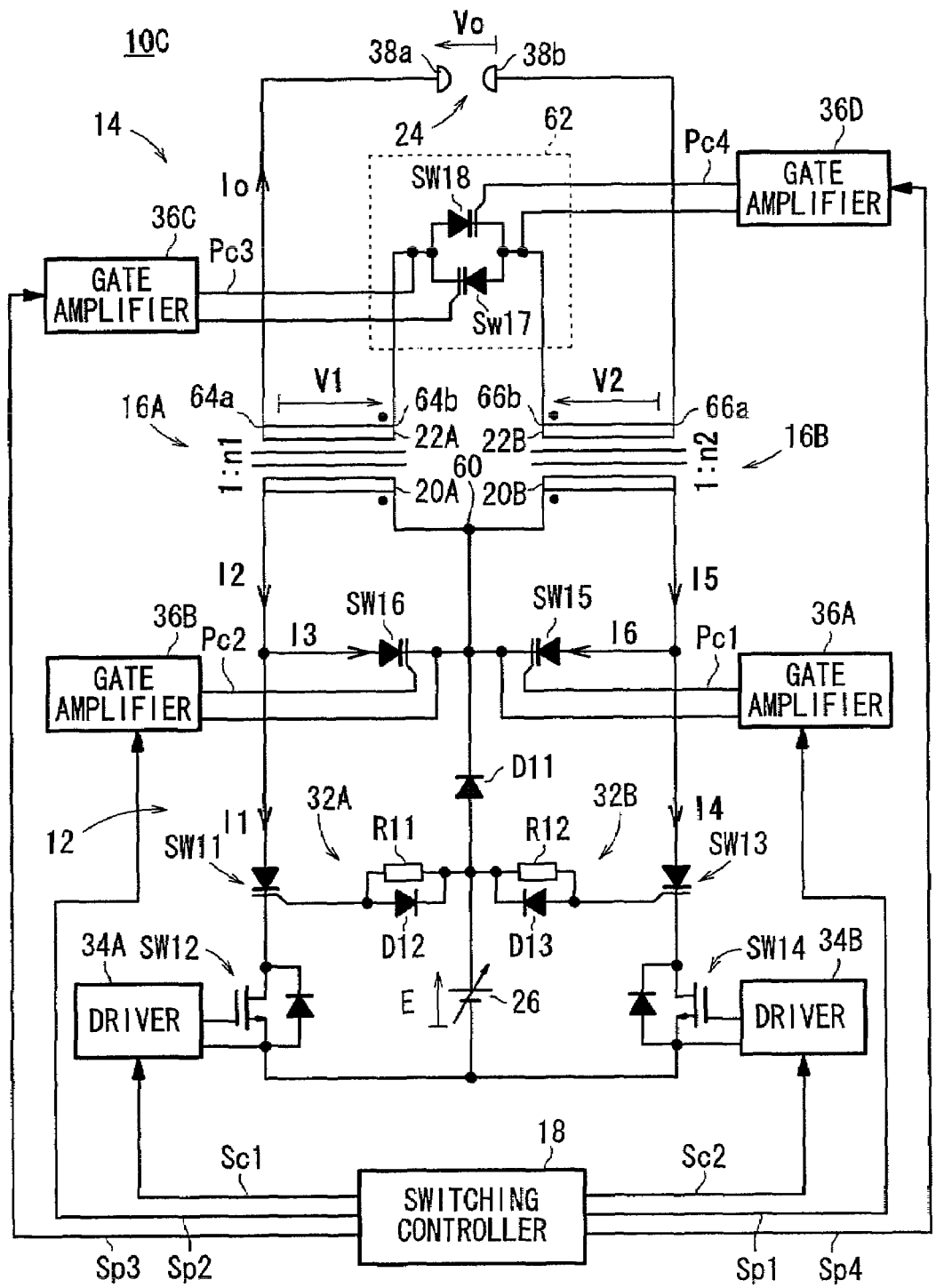
FIG. 11 is a circuit diagram of a pulse power source according to a third embodiment of the present invention, the pulse power source being in a mode 0 (initial state)

Specifically, as shown in FIG. 11, the third pulse power source 10C has a first circuit 12, a second circuit 14, two transformers (a first transformer 16A and a second transformer 16B) coupling the first circuit 12 and the second circuit 14 to each other, a switching controller 18, and an eleventh diode D11.

The first transformer 16A and the second transformer 16B have respective primary windings (a first primary winding 20A and a second primary winding 20B) connected to the first circuit 12 and respective secondary windings (a first secondary winding 22A and a second secondary winding 22B) connected to the second circuit 14. The third pulse power source 10C has its output power extracted from the output terminals of the second circuit 14. A load 24 is connected between the output terminals. The load 24 may be a resistive load or a capacitive load (discharge gap or the like).

The first circuit 12 comprises a DC power supply (power supply voltage=E) 26, the eleventh diode D11 which is forwardly connected between a contact 60 between the first primary winding 20A and the second primary winding 20B and the positive terminal of the DC power supply 26, an eleventh semiconductor switch SW11 connected between the first primary winding 20A and the negative terminal of the DC power supply 26, for supplying a current from the DC power supply 26 to the first primary winding 20A, a twelfth semiconductor switch SW12 for controlling the turn-on and turn-off of the eleventh semiconductor switch SW11, a thirteenth semiconductor switch SW13 connected between the second primary winding 20B and the negative terminal of the DC power supply 26, for supplying a current from the DC power supply 26 to the second primary winding 20B, and a fourteenth semiconductor switch SW14 for controlling the turn-on and turn-off of the thirteenth semiconductor switch SW13.

Each of the eleventh semiconductor switch SW11 and the thirteenth semiconductor switch SW13 may comprise a self-extinguishing or commutation-extinguishing device. In the third pulse power source 10C, each of the eleventh semiconductor switch SW11 and the thirteenth semiconductor switch SW13 comprises an SI thyristor. However, each of the eleventh semiconductor switch SW11 and the thirteenth semiconductor switch SW13 may comprise a bipolar transistor, a GTO, or the like.

A parallel-connected circuit 32A of a twelfth diode D12 and an eleventh resistor R11 is connected between the gate terminal of the eleventh semiconductor switch SW11 and the anode terminal of the eleventh diode D11. The twelfth diode D12 has an anode terminal connected to the gate terminal of the eleventh semiconductor switch SW11 and a cathode terminal connected to the anode terminal of the eleventh diode D11.

A parallel-connected circuit 32B of a thirteenth diode D13 and a twelfth resistor R12 is connected between the gate terminal of the thirteenth semiconductor switch SW13 and the anode terminal of the eleventh diode D11. The thirteenth diode D13 has an anode terminal connected to the gate terminal of the thirteenth semiconductor switch SW13 and a cathode terminal connected to the anode terminal of the eleventh diode D11.

Each of the twelfth semiconductor switch SW12 and the fourteenth semiconductor switch SW14 may comprise a self-extinguishing or commutation-extinguishing device. In the third pulse power source 10C, each of the twelfth semiconductor switch SW12 and the fourteenth semiconductor switch SW14 comprises, for example, an n-channel power metal oxide semiconductor field-effect transistor incorporating an avalanche diode held in anti-parallel connection thereto.

The twelfth semiconductor switch SW12 has a source terminal connected to the negative terminal of the DC power supply 26 and a drain terminal connected to the cathode terminal of the eleventh semiconductor switch SW11.

The fourteenth semiconductor switch SW14 has a source terminal connected to the negative terminal of the DC power supply 26 and a drain terminal connected to the cathode terminal of the thirteenth semiconductor switch SW13.

The twelfth semiconductor switch SW12 has a gate terminal connected to a first driver circuit 34A for amplifying a first switching control signal Sc1 from the switching controller 18 and supplying the amplified first switching control signal Sc1 to the gate terminal of the twelfth semiconductor switch SW12. The fourteenth semiconductor switch SW14 has a gate terminal connected to a second driver circuit 34B for amplifying a second switching control signal Sc2 from the switching controller 18 and supplying the amplified second switching control signal Sc2 to the gate terminal of the fourteenth semiconductor switch SW14.

The first circuit 12 also has a fifteenth semiconductor switch SW15 connected between the cathode terminal of the eleventh diode D11 and the anode terminal of the thirteenth semiconductor switch SW13, and a sixteenth semiconductor switch SW16 connected between the cathode terminal of the eleventh diode D11 and the anode terminal of the eleventh semiconductor switch SW11.

The fifteenth semiconductor switch SW15 is connected in such a direction that the voltage E of the DC power supply 26 is reverse-biased during the period in which the fourteenth semiconductor switch SW14 and the thirteenth semiconductor switch SW13 are turned on. The sixteenth semiconductor switch SW16 is connected in such a direction that the voltage E of the DC power supply 26 is reverse-biased during the period in which the twelfth semiconductor switch SW12 and the eleventh semiconductor switch SW11 are turned on.

Specifically, the fifteenth semiconductor switch SW15 has a cathode terminal connected to the cathode terminal of the eleventh diode D11, and the sixteenth semiconductor switch SW16 has a cathode terminal connected to the cathode terminal of the eleventh diode D11.

Each of the fifteenth semiconductor switch SW15 and the sixteenth semiconductor switch SW16 may comprise a self-extinguishing or commutation-extinguishing device. In the third pulse power source 10C, each of the fifteenth semiconductor switch SW15 and the sixteenth semiconductor switch SW16 comprises an SI thyristor. However, each of the fifteenth semiconductor switch SW15 and the sixteenth semiconductor switch SW16 may comprise a bipolar transistor, a GTO, or the like.

A first gate amplifier 36A for forming a first control signal Sp1 from the switching controller 18 into a pulse and outputting the pulse as a first pulse signal Pc1 is connected between the gate and cathode terminals of the fifteenth semiconductor switch SW15. A second gate amplifier 36B for forming a second control signal Sp2 from the switching controller 18 into a pulse and outputting the pulse as a second pulse signal Pc2 is connected between the gate and cathode terminals of the sixteenth semiconductor switch SW16.

The second circuit 14 has a parallel-connected circuit 62 of two semiconductor switches (a seventeenth semiconductor switch SW17 and an eighteenth semiconductor switch SW18) connected parallel to each other in opposite directions. The parallel-connected circuit 62 is connected between the first secondary winding 22A and the second secondary winding 22B.

The seventeenth semiconductor switch SW17 is connected in such a direction that a voltage induced across the first secondary winding 22A is reverse-biased during the period in which the twelfth semiconductor switch SW12 and the eleventh semiconductor switch SW11 are turned on. The eighteenth semiconductor switch SW18 is connected in such a direction that a voltage induced across the second secondary winding 22B is reverse-biased during the period in which the fourteenth semiconductor switch SW14 and the thirteenth semiconductor switch SW13 are turned on.

Specifically, the first secondary winding 22A has a terminal 64a connected to an output terminal (an electrode 38a) of the second circuit 14, and the second secondary winding 22B has a terminal 66a connected to another output terminal (an electrode 38b) of the second circuit 14. The seventeenth semiconductor switch SW17 has a cathode terminal connected to another terminal 64b of the first secondary winding 22A and anode terminal connected to another terminal 66b of the second secondary winding 22B. Similarly, the eighteenth semiconductor switch SW18 has a cathode terminal connected to the other terminal 66b of the second secondary winding 22B and anode terminal connected to the other terminal 64b of the first secondary winding 22A.

Each of the seventeenth semiconductor switch SW17 and the eighteenth semiconductor switch SW18 may comprise a self-extinguishing or commutation-extinguishing device. In the third pulse power source 10C, each of the seventeenth semiconductor switch SW17 and the eighteenth semiconductor switch SW18 comprises an SI thyristor. However, each of the seventeenth semiconductor switch SW17 and the eighteenth semiconductor switch SW18 may comprise a bipolar transistor, a GTO, or the like.

A third gate amplifier 36C for forming a third control signal Sp3 from the switching controller 18 into a pulse and outputting the pulse as a third pulse signal Pc3 is connected between the gate and cathode terminals of the seventeenth semiconductor switch SW17. A fourth gate amplifier 36D for forming a fourth control signal Sp4 from the switching controller 18 into a pulse and outputting the pulse as a fourth pulse signal Pc4 is connected between the gate and cathode terminals of the eighteenth semiconductor switch SW18.

Circuit operation of the third pulse power source 10C will be described below with reference to the circuit diagram shown in FIG. 11, operation diagrams shown in FIGS. 12 through 17, and waveform diagrams shown in FIGS. 18 and 19.

It is assumed that the voltage produced by the DC power supply 26 is represented by E (V), the turn ratio of the first transformer 16A (the number of turns of the first primary winding 20A/the number of turns of the first secondary winding 22A) is represented by 1/n1, the turn ratio of the second transformer 16B (the number of turns of the second primary winding 20B/the number of turns of the second secondary winding 22B) is represented by 1/n2, the primary inductance (exciting inductance) of the first transformer 16A by Lex1, and the primary inductance (exciting inductance) of the second transformer 16B by Lex2.

In a mode 0 (initial state) of the third pulse power source 10C, all the switches are turned off, as shown in FIG. 11.

Figure 18:
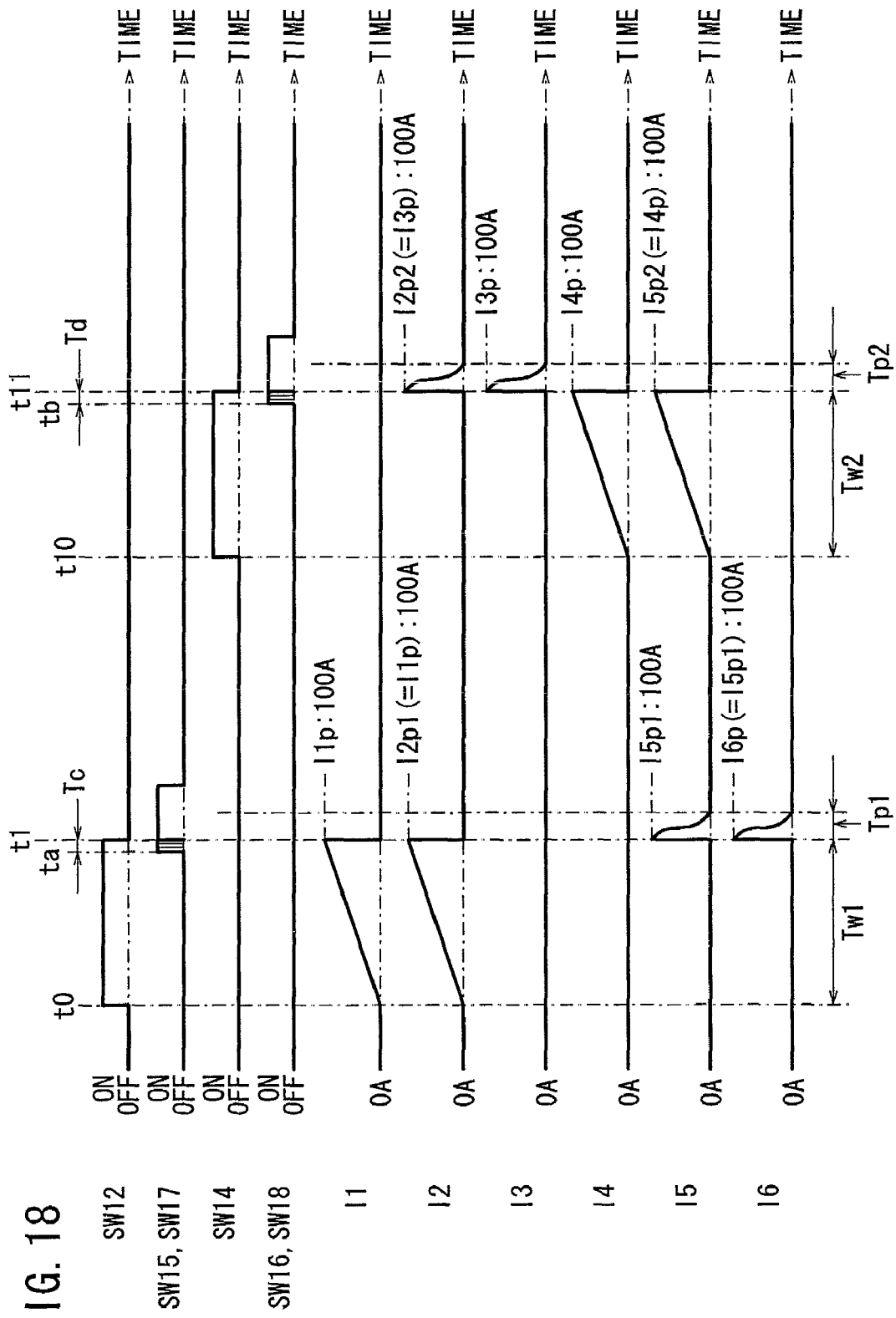
FIG. 18 is a diagram showing signal waveforms (part 1) in circuit operation of the pulse power source according to the third embodiment.
Figure 19:
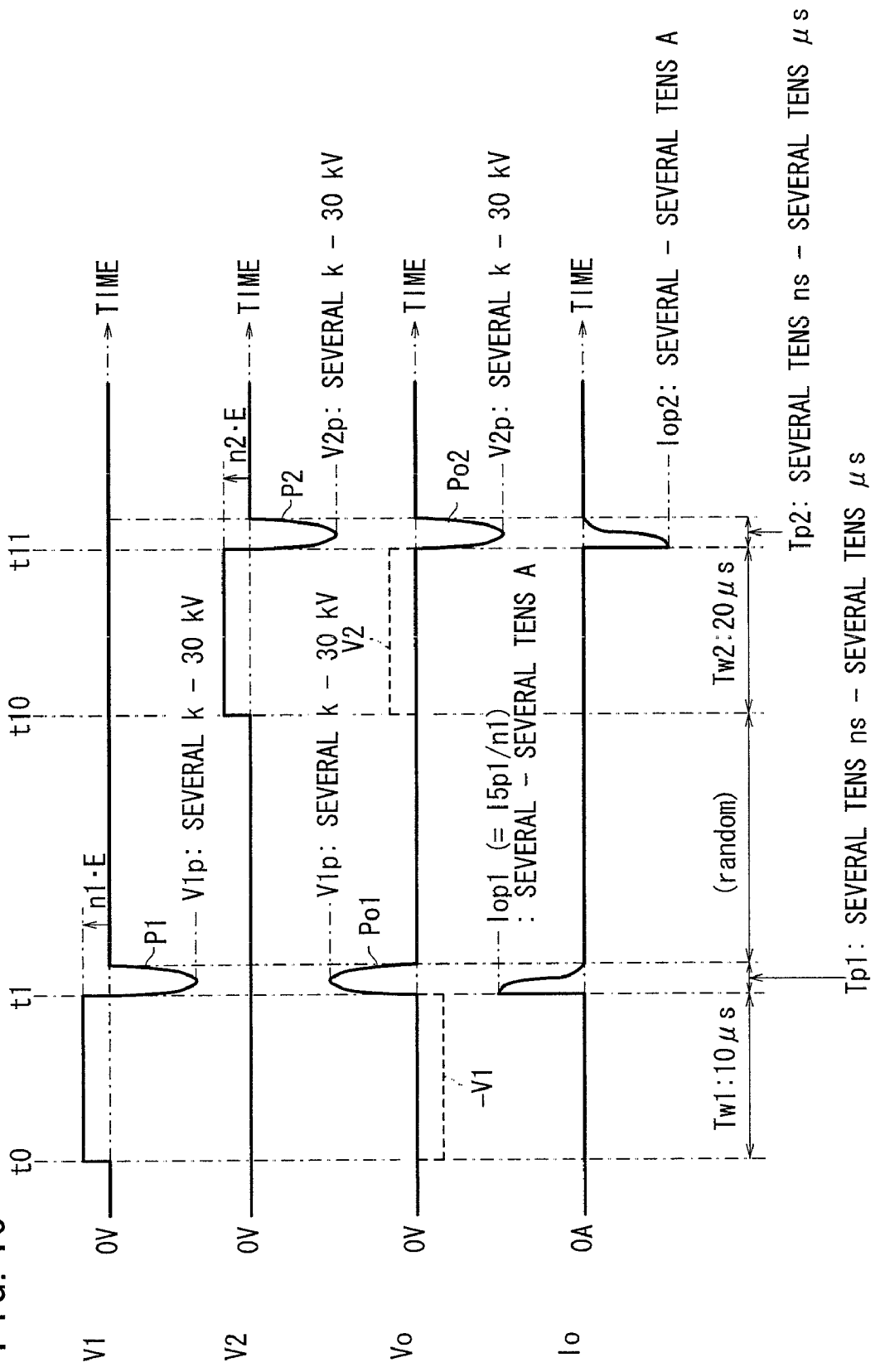
FIG. 19 is a diagram showing signal waveforms (part 2) in circuit operation of the pulse power source according to the third embodiment.

Thereafter, at time t0 shown in FIG. 18, a high-level switching control signal Sc1 is supplied between the gate and source terminals of the twelfth semiconductor switch SW12, turning on the twelfth semiconductor switch SW12.

Figure 12:
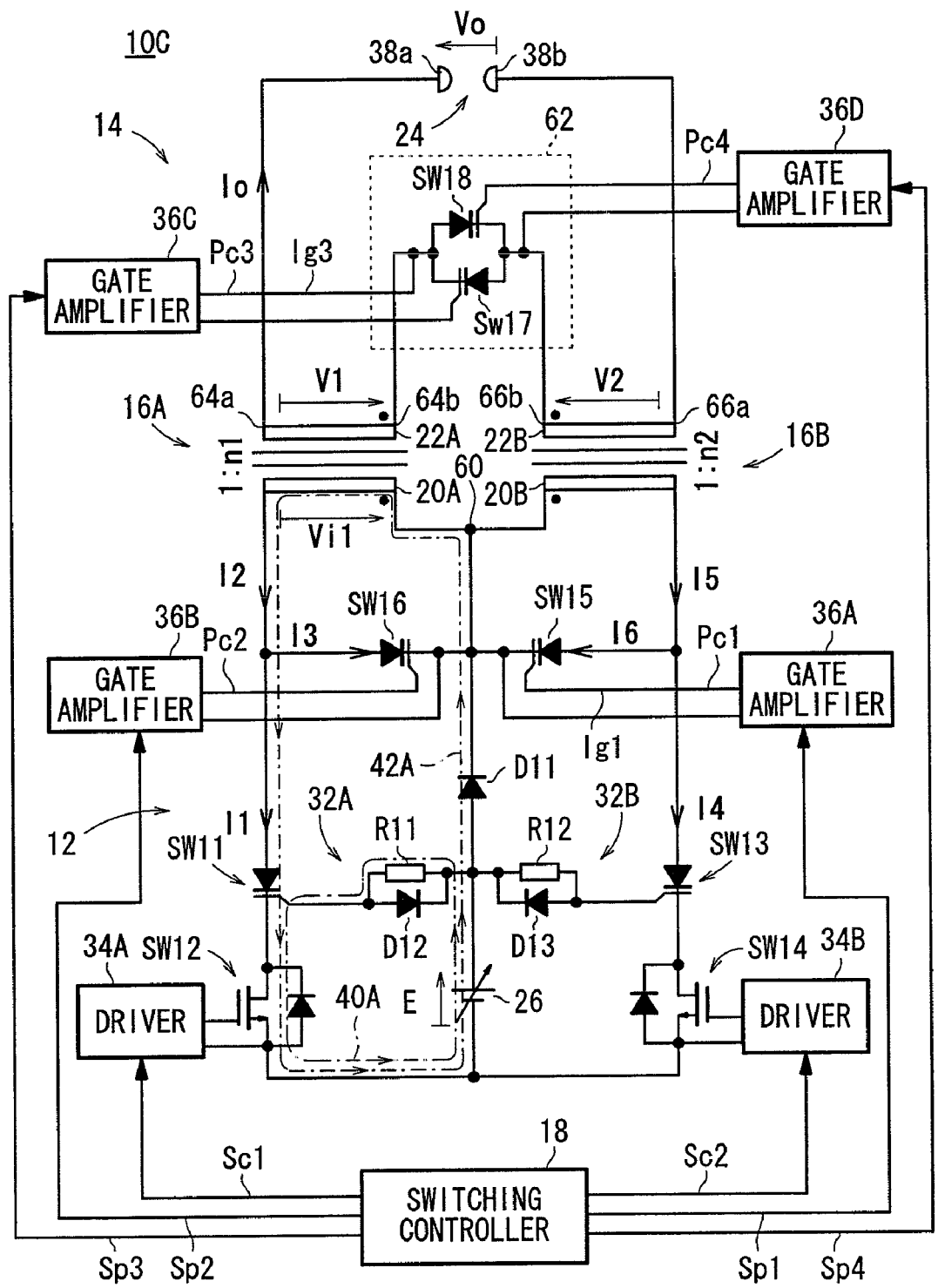
FIG. 12 is a circuit diagram of the pulse power source according to the third embodiment of the present invention, the pulse power source being in a mode 1 (charging period)

When the twelfth semiconductor switch SW12 is turned on at time t0, the third pulse power source 10C enters a mode 1 (charging period). In the mode 1, as shown in FIG. 12, a current flows along a path 40A from the DC power supply 26 to the eleventh resistor R11 to the gate terminal of the eleventh semiconductor switch SW11 to the cathode terminal of the eleventh semiconductor switch SW11 to the twelfth semiconductor switch SW12, turning on the eleventh semiconductor switch SW11. Now, a voltage Vi1=E (V) is applied across the first primary winding 20A of the first transformer 16A, causing a current I1 (=I2) to flow along a path 42A from the DC power supply 26 to the first primary winding 20A to the eleventh semiconductor switch SW11 to the twelfth semiconductor switch SW12. The current I1 increases linearly with time in a positive direction at a gradient (E/Lex1) (see FIG. 18), charging electromagnetic energy in the first primary winding 20A.

During a period Tw1 in which the twelfth semiconductor switch SW12 is turned on, a constant positive voltage V1 is induced across the first secondary winding 22A. The voltage V1 induced across the first secondary winding 22A has a level n1·E (V) (see FIG. 19).

In a final stage of the period Tw1, the switching controller 18 controls the first gate amplifier 36A and the third gate amplifier 36C to output first and third pulse signals Pc1, Pc3, causing a first gate current Ig1 and a third gate current Ig3 to flow respectively to the fifteenth semiconductor switch SW15 and the seventeenth semiconductor switch SW17 which are then turned on. The final stage of the period Tw1 may begin at time ta (see FIG. 18) at the beginning of a period Tc in which the fifteenth semiconductor switch SW15 and the seventeenth semiconductor switch SW17 are fully turned on by the first gate current Ig1 and the third gate current Ig3 supplied respectively thereto.

Since the seventeenth semiconductor switch SW17 is reverse-biased between the anode and cathode terminals thereof by the positive voltage V1 induced across the first secondary winding 22A, no current flows in the second circuit 14. In other words, since a negative voltage (−V1: the voltage indicated by the broken line as the voltage Vo in FIG. 19) based on the induced voltage V1 is prevented from being applied to the electrodes 38a, 38b of the load 24 by the seventeenth semiconductor switch SW17, no arc discharge is caused in a reactor which houses the electrodes 38a, 38b therein.

As no current flows in the second circuit 14, no current flows along a path including the fifteenth semiconductor switch SW15, i.e., a path from the cathode terminal of the fifteenth semiconductor switch SW15 to the contact 60 to the second primary winding 20B to the anode terminal of the fifteenth semiconductor switch SW15.

Furthermore, as the sixteenth semiconductor switch SW16 is reverse-biased between the anode and cathode terminals thereof by the voltage E of the DC power supply 26, the sixteenth semiconductor switch SW16 is fully turned off and kept fully turned off.

The current I1 flowing through the first primary winding 20A becomes I1p (=E·Tw1/Lex1) at time t1. When a desired level of electromagnetic energy (=Lex1·I1p$^2$/2) is obtained, the switching controller 18 supplies a low-level first switching control signal Sc1 to turn off the twelfth semiconductor switch SW12.

Figure 13:
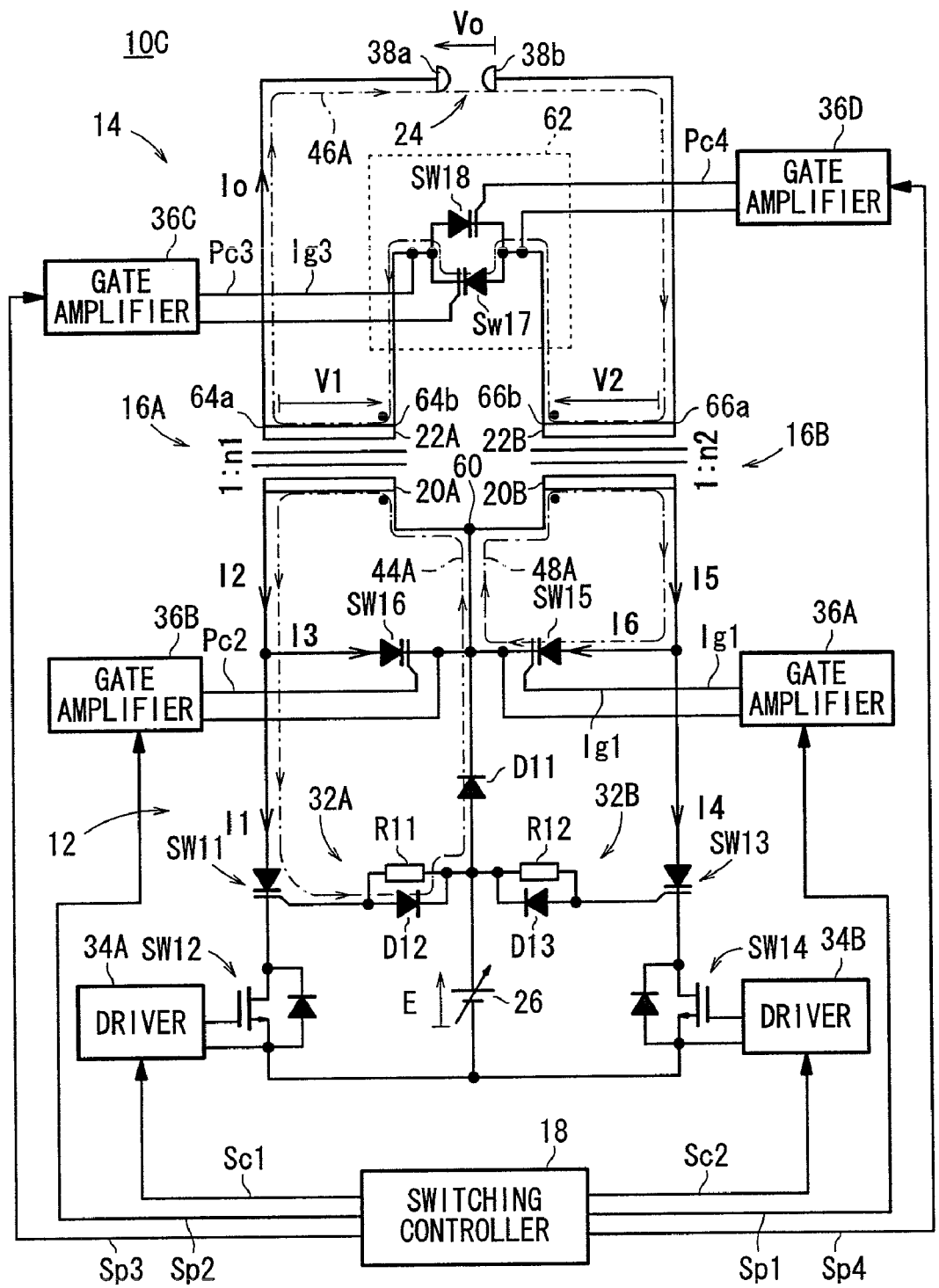
FIG. 13 is a circuit diagram of the pulse power source according to the third embodiment of the present invention, the pulse power source being in a mode 2 (commutation period)

When the twelfth semiconductor switch SW12 is turned off at time t1, the third pulse power source 10C enters a mode 2 (commutation period). As shown in FIG. 13, a current I1 (=I2) flows in the first circuit 12 along a path 44A from the first primary winding 20A to the eleventh semiconductor switch SW11 to the twelfth diode D12 to the eleventh diode D11, starting to turn off the eleventh semiconductor switch SW11. At the same time, a current Io starts to flow in the second circuit 14 due to the electromagnetic energy stored in the first primary winding 20A (see a path 46A). At this time, since a sufficient first gate current Ig1 and a sufficient third gate current Ig3 have flowed to the fifteenth semiconductor switch SW15 and the seventeenth semiconductor switch SW17 to turn on the fifteenth semiconductor switch SW15 and the seventeenth semiconductor switch SW17 before the twelfth semiconductor switch SW12 is turned off, a current I5 (=I6) flows along the path including the fifteenth semiconductor switch SW15, i.e., the path 48A from the cathode terminal of the fifteenth semiconductor switch SW15 to the contact 60 to the second primary winding 20B to the anode terminal of the fifteenth semiconductor switch SW15. At this time, since the sufficient first gate current Ig1 and the sufficient third gate current Ig3 have flowed to the fifteenth semiconductor switch SW15 and the seventeenth semiconductor switch SW17 to turn on the fifteenth semiconductor switch SWTS and the seventeenth semiconductor switch SW17 before the eleventh semiconductor switch SW11 is turned off, a sharply rising, large current Io flows with a low loss in the second circuit 14. Thereafter, the eleventh semiconductor switch SW11 is completely turned off.

Figure 14:
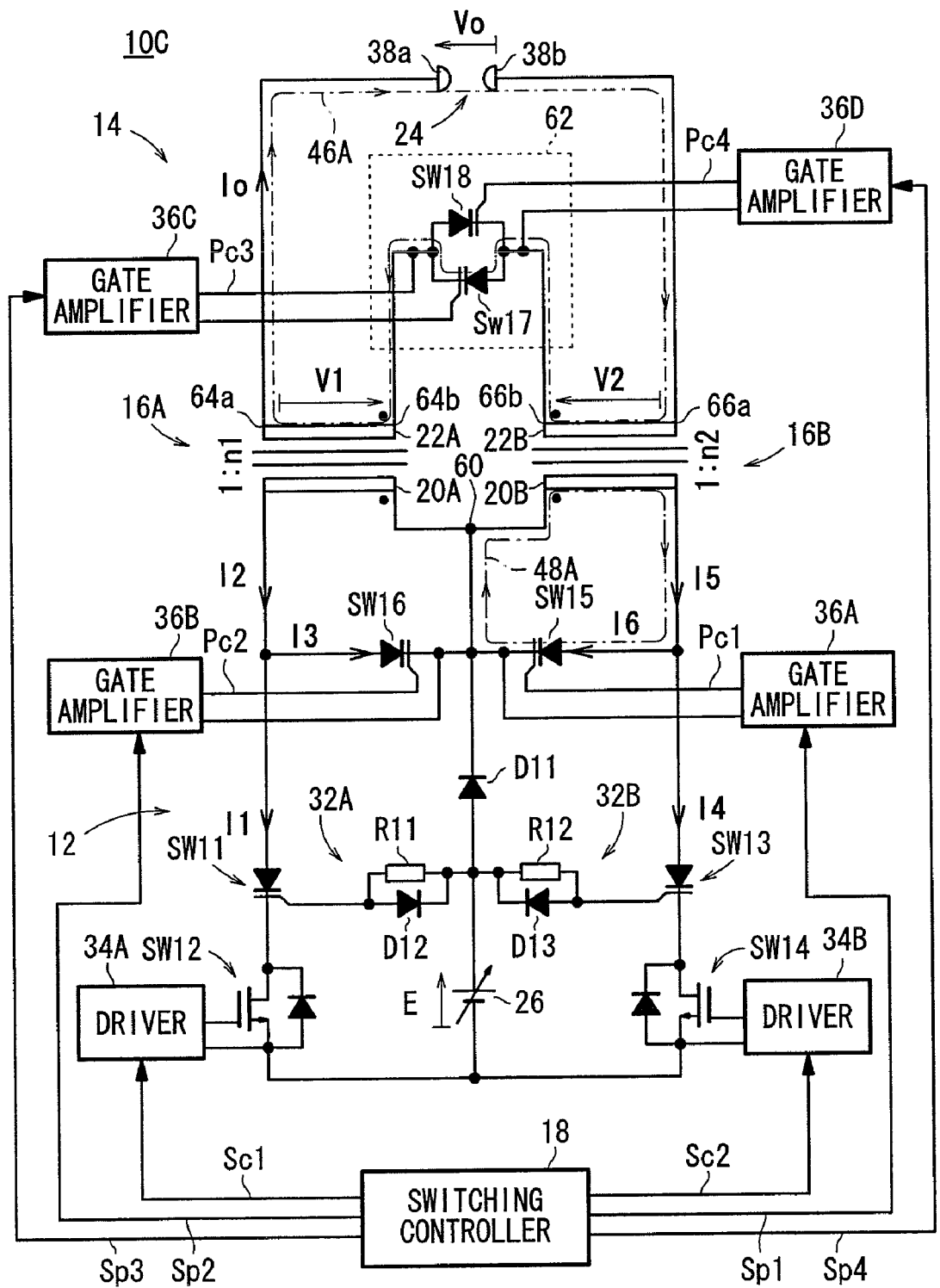
FIG. 14 is a circuit diagram of the pulse power source according to the third embodiment of the present invention, the pulse power source being in a mode 3 (discharging period)

When the eleventh semiconductor switch SW11 is completely turned off, the third pulse power source 10C enters a mode 3 (discharging period). As shown in FIG. 14, because of resonance between the exciting inductance and the capacitance between the electrodes 38a, 38b of the load 24, the output voltage Vo between the electrodes 38a, 38b increases, outputting a positive pulse Po1 having a positive voltage value (V1p) as its peak value (discharge starting voltage) (see FIG. 19), thereby reducing the output current Io. The gradient of the rising edge of the positive pulse Po1 is determined by the resonant frequency between the exciting inductance (Lex1) of the first transformer 16A and the capacitance of the load 24. A negative pulse P1 having a negative voltage value (V1p) as its peak value, which is of opposite polarity to the output voltage Vo, is induced across the first secondary winding 22A.

When the output voltage Vo reaches the discharge starting voltage V1p, the output voltage Vo quickly decreases. The output current Io decreases with a time constant determined by the characteristics of the load 24 during the discharge, and the third pulse power source 10C enters the mode 0 (initial stage) shown in FIG. 11 again.

The positive pulse Po1 has a pulse duration Tp1 determined by the resonance between the exciting inductance and the capacitance between the electrodes 38a, 38b, during the characteristics of the load 24 during the discharge. The pulse duration Tp1 increases, as the resonant frequency is lower.

If the voltage E of the DC power supply 26 is 100 V, the exciting inductance Lex1 is 10 (μH), and the turn ratio of the first transformer 16A is 1/(5 to 10), then the peak value I1p of the current I1 (=I2) flowing through the first primary winding 20A is about 100 (A), the peak value V1P of the output voltage Vo is in the range from several to 30 (kV), and the peak value Iop1 of the output current Io flowing in the second circuit 14 is in the range from 10 to 20 (A). The period of time in which the twelfth semiconductor switch SW12 is turned on, i.e., a time period Tw1 from time t0 to time t1, is about 10 μsec.

Thereafter, at time t10 shown in FIG. 18, a high-level second switching control signal Sc2 is supplied between the gate and source terminals of the fourteenth semiconductor switch SW14, turning on the fourteenth semiconductor switch SW14.

Figure 15:
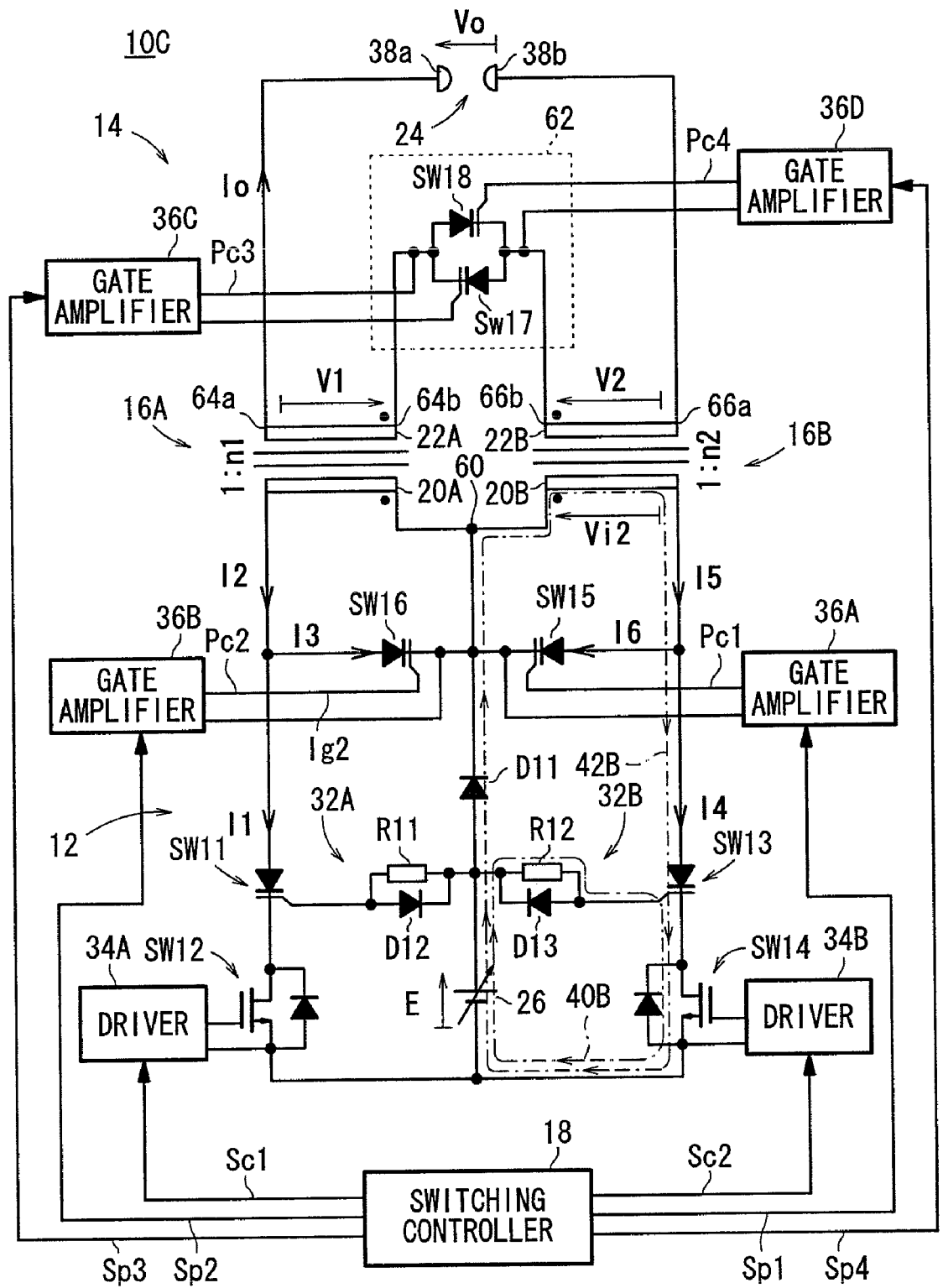
FIG. 15 is a circuit diagram of the pulse power source according to the third embodiment of the present invention, the pulse power source being in a mode 4 (charging period)

When the fourteenth semiconductor switch SW14 is turned on at time t10, the third pulse power source 10C enters a mode 4 (charging period). In the mode 4, as shown in FIG. 15, a current flows along a path 40B from the DC power supply 26 to the twelfth resistor R12 to the gate terminal of the thirteenth semiconductor switch SW13 to the cathode terminal of the thirteenth semiconductor switch SW13 to the fourteenth semiconductor switch SW14, turning on the thirteenth semiconductor switch SW13. Now, a voltage Vi2=E (V) is applied across the second primary winding 20B of the second transformer 16B, causing a current I4 (=I5) to flow along a path 42B from the DC power supply 26 to the second primary winding 20B to the thirteenth semiconductor switch SW13 to the fourteenth semiconductor switch SW14. The current I4 increases linearly with time in a positive direction at a gradient (E/Lex2) (see FIG. 18), charging electromagnetic energy in the second primary winding 20B.

During a period Tw2 in which the fourteenth semiconductor switch SW14 is turned on, a constant positive voltage V2 is induced across the second secondary winding 22B. The voltage V2 induced across the second secondary winding 22B has a level n2·E (V) (see FIG. 19).

In a final stage of the period Tw2, the switching controller 18 controls the second gate amplifier 36B and the fourth gate amplifier 36D to output respective second and fourth pulse signals Pc2, Pc4, causing a second gate current Ig2 and a fourth gate current Ig4 to flow respectively to the sixteenth semiconductor switch SW16 and the eighteenth semiconductor switch SW18 which are then turned on. The final stage of the period Tw2 may begin at time tb just before a period Td in which the sixteenth semiconductor switch SW16 and the eighteenth semiconductor switch SW18 are fully turned on by the second gate current Ig2 and the fourth gate current Ig4 supplied respectively thereto.

Since the eighteenth semiconductor switch SW18 is reverse-biased between the anode and cathode terminals thereof by the positive voltage V2 induced across the second secondary winding 22B, no current flows in the second circuit 14. In other words, as a positive voltage (V2: the voltage indicated by the broken-line curve as the voltage Vo in FIG. 19) based on the induced voltage V2 is prevented from being applied to the electrodes 38a, 38b of the load 24 by the eighteenth semiconductor switch SW18, no arc discharge is caused in the reactor which houses the electrodes 38a, 38b therein.

As no current flows in the second circuit 14, no current flows along a path including the sixteenth semiconductor switch SW16, i.e., a path from the cathode terminal of the sixteenth semiconductor switch SW16 to the contact 60 to the first primary winding 20A to the anode terminal of the sixteenth semiconductor switch SW16.

Furthermore, because the fifteenth semiconductor switch SW15 is reverse-biased between the anode and cathode terminals thereof by the voltage E of the DC power supply 26, the fifteenth semiconductor switch SW15 is fully turned off and kept in that state.

The current I4 (=I5) flowing through the second primary winding 20B becomes I4p (=E·Tw2/Lex2) at time t11. When a desired level of electromagnetic energy (=Lex2·I4p$^2$/2) is obtained, the switching controller 18 supplies a low-level switching control signal Sc2 to turn off the fourteenth semiconductor switch SW14.

Figure 16:
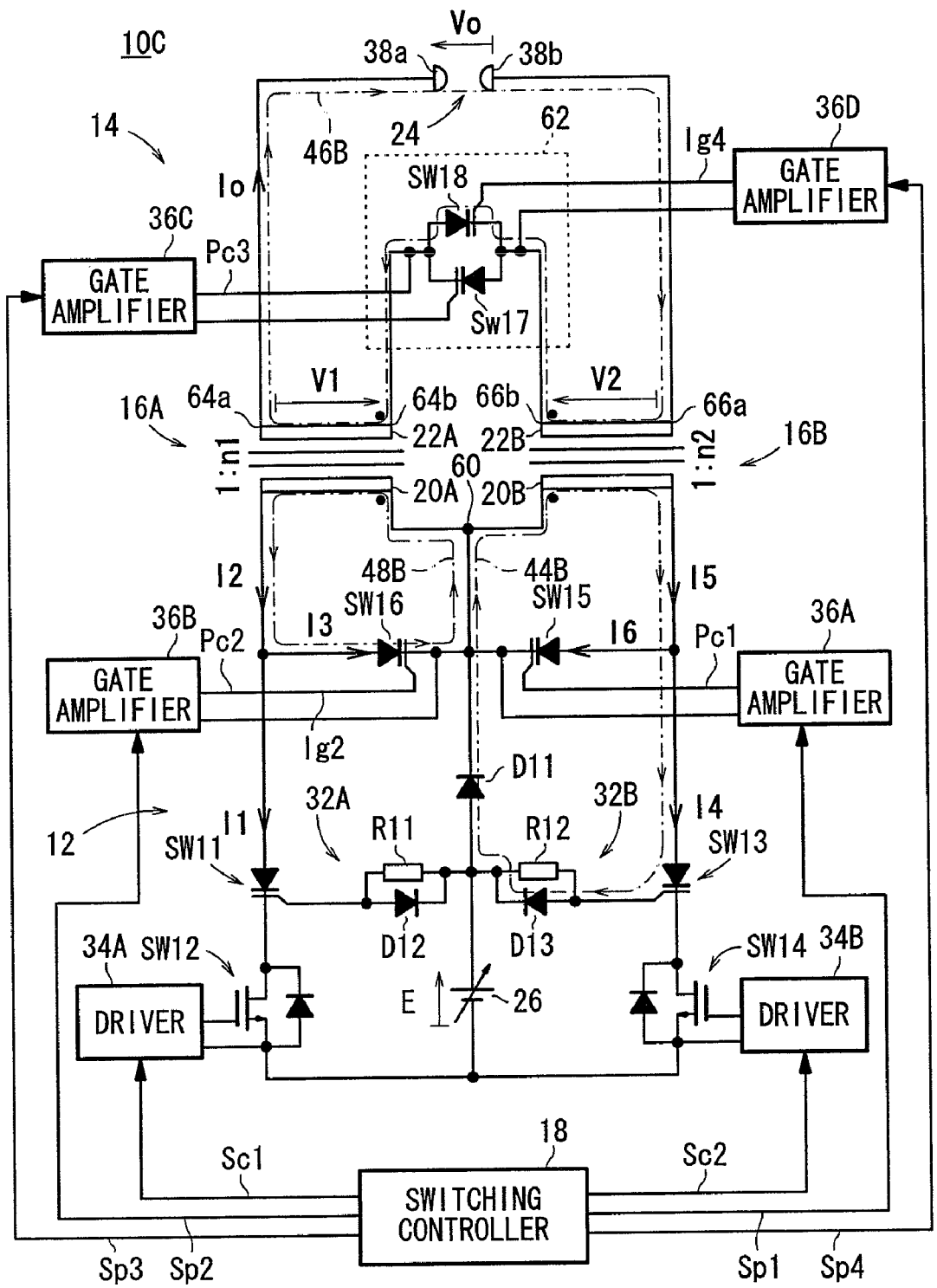
FIG. 16 is a circuit diagram of the pulse power source according to the third embodiment of the present invention, the pulse power source being in a mode 5 (commutation period)

When the fourteenth semiconductor switch SW14 is turned off at time t11, the third pulse power source 10C enters a mode 5 (commutation period). As shown in FIG. 16, a current flows in the first circuit 12 along a path 44B from the second primary winding 20B to the thirteenth semiconductor switch SW13 to the thirteenth diode D13 to the eleventh diode D11, starting to turn off the thirteenth semiconductor switch SW13. At the same time, a current starts to flow in the second circuit 14 due to the electromagnetic energy stored in the second primary winding 20B (see a path 46B). At this time, since a sufficient second gate current Ig2 and a sufficient fourth gate current Ig4 have flowed to the sixteenth semiconductor switch SW16 and the eighteenth semiconductor switch SW18 to turn on the sixteenth semiconductor switch SW16 and the eighteenth semiconductor switch SW18 before the fourteenth semiconductor switch SW14 is turned off, a current I2 (=I3) flows along the path including the sixteenth semiconductor switch SW16, i.e., the path 48B from the cathode terminal of the sixteenth semiconductor switch SW16 to the contact 60 to the first primary winding 20A to the anode terminal of the sixteenth semiconductor switch SW16. At this time, since the sufficient second gate current Ig2 and the sufficient fourth gate current Ig4 have flowed to the sixteenth semiconductor switch SW16 and the eighteenth semiconductor switch SW18 to turn on the sixteenth semiconductor switch SW16 and the eighteenth semiconductor switch SW18 before the fourteenth semiconductor switch SW14 is turned off, a sharply rising, large current Io flows with a low loss in the second circuit 14. Thereafter, the thirteenth semiconductor switch SW13 is completely turned off.

Figure 17:
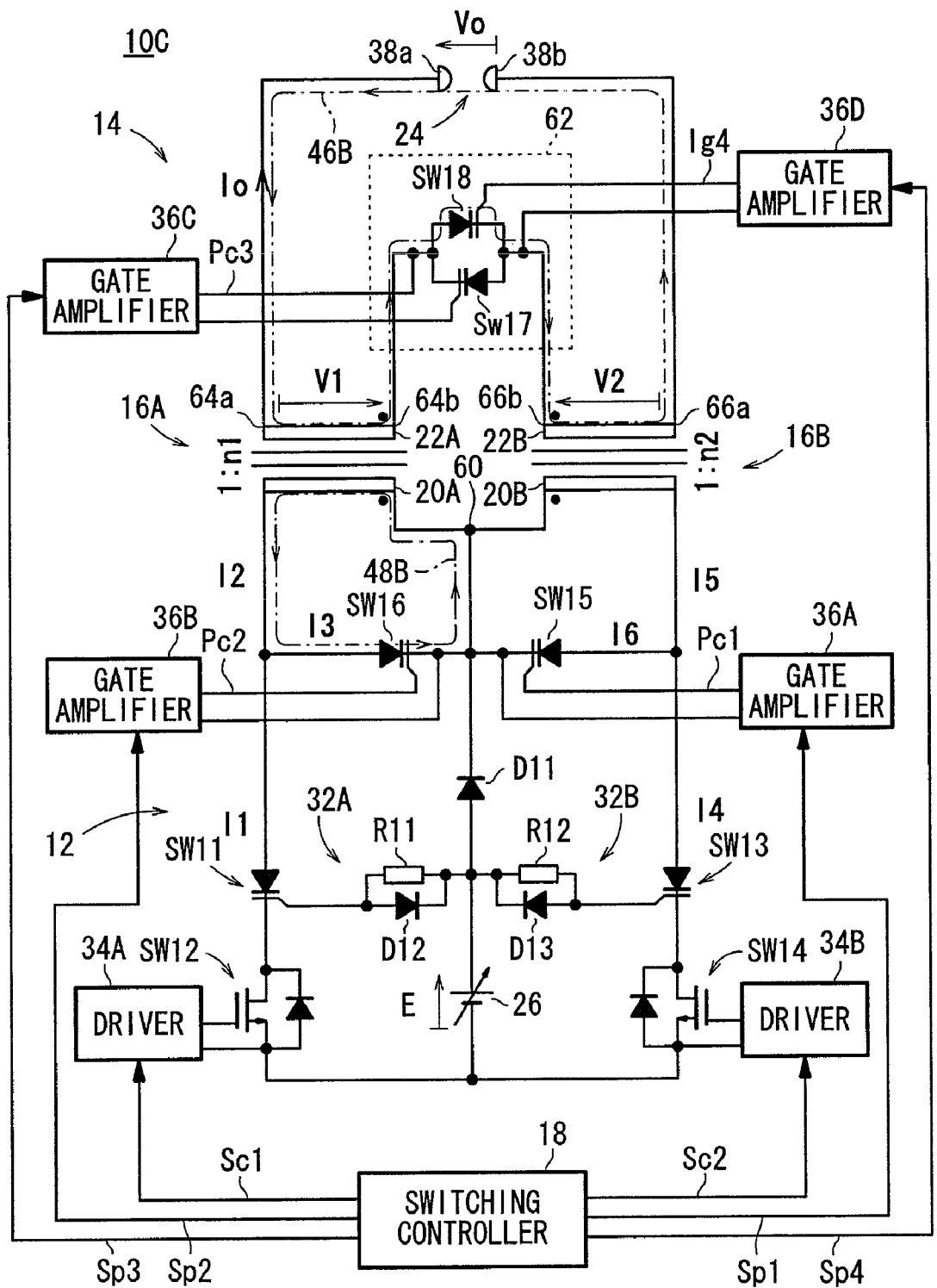
FIG. 17 is a circuit diagram of the pulse power source according to the third embodiment of the present invention, the pulse power source being in a mode 6 (charging period)

When the thirteenth semiconductor switch SW13 is completely turned off, the third pulse power source 10C enters a mode 6 (discharging period). As shown in FIG. 17, because of resonance between the exciting inductance and the capacitance between the electrodes 38a, 38b, the absolute value of the output voltage Vo between the electrodes 38a, 38b increases, outputting a negative pulse Po2 having a negative voltage value (V2p) as its peak value (discharge starting voltage) (see FIG. 19), thereby reducing the output current Io. The gradient of the rising edge of the negative pulse Po2 is determined by the resonant frequency between the exciting inductance (Lex2) of the second transformer 16B and the capacitance of the load 24. A negative pulse P2 having a negative voltage value (V2p) as its peak value, which is of the same polarity as the output voltage Vo, is induced across the second secondary winding 22B.

When the output voltage Vo reaches the discharge starting voltage V2p, the absolute value of the output voltage Vo quickly decreases. The output current Io decreases with a time constant determined by the characteristics of the load 24 during the discharge, and the third pulse power source 10C enters the mode 0 (initial stage) shown in FIG. 11 again.

The negative pulse Po2 has a pulse duration Tp2 determined by the resonance between the exciting inductance and the capacitance between the electrodes 38a, 38b, and the characteristics of the load 24 during the discharge. The pulse duration Tp2 increases, as the resonant frequency is lower.

If the voltage E of the DC power supply 26 is 100 V, the exciting inductance Lex2 is 20 (μH), and the turn ratio of the second transformer 16B is 1/(5 to 10), then the peak value I4p of the current I4 flowing through the second primary winding 20B is about 100 (A), the peak value V2P of the output voltage Vo is in the range from—several to −30 (kV), and the peak value Iop2 of the output current Io flowing through the second circuit 14 is in the range from −10 to −20 (A). The period of time in which the fourteenth semiconductor switch SW14 is turned on, i.e., a time period Tw2 from time t10 to time t11, is about 20 μsec.

The above sequence of operation is repeated for the third pulse power source 10C to output a succession of alternate positive high-voltage pulses Po1 and negative high-voltage pulses Po2.

Thus, the third pulse power source 10C stores a first induced energy in the first transformer 16A, generates a positive high-voltage pulse Po1 when the first induced energy is released from the first transformer 16A, stores a second induced energy in the second transformer 16B, and generates a negative high-voltage pulse Po2 when the second induced energy is released from the second transformer 16B.

Therefore, the third pulse power source 10C can successively generate positive high-voltage pulses Po1 and negative high-voltage pulses Po2, with the pulse duration Tp1 of the positive pulses Po1 and the pulse duration Tp2 of the negative pulses Po2 being independently variable. As a result, it is possible for the third pulse power source 10C to generate pulses depending on appropriate conditions of various applications of a plasma process which is based on the discharge of the high-voltage pulses Po1, Po2, resulting in accelerating film growth and improving gas decomposition efficiency. The third pulse power source 10C is thus highly versatile.

The third pulse power source 10C has the fifteenth semiconductor switch SW15 which is turned on in a zero-current state during at least the final stage of the period Tw1 (the period in which the twelfth semiconductor switch SW12 is turned on) for storing the first induced energy in the first transformer 16A, and the sixteenth semiconductor switch SW16 which is turned on in a zero-current state during at least the final stage of the period Tw2 (the period in which the fourteenth semiconductor switch SW14 is turned on) for storing the second induced energy in the second transformer 16B. Therefore, a sharply rising, large current Io can flow with a low loss in the second circuit 14.

Furthermore, the third pulse power source 10C has the seventeenth semiconductor switch SW17 which is turned on while being reverse-biased by the voltage V1 generated across the first secondary winding 22A of the first transformer 16A during at least the final stage of the period Tw1 for storing the first induced energy in the first transformer 16A, and the eighteenth semiconductor switch SW18 which is turned on while being reverse-biased by the voltage V2 generated across the second secondary winding 22B of the second transformer 16B during at least the final stage of the period Tw2 for storing the second induced energy in the second transformer 16B. Consequently, the induced voltages V1, V2 are not applied to the load 24 connected to the second circuit 14, i.e., the electrodes 38a, 38b of the load 24, during the charging periods Tw1, Tw2 in the first circuit 12, improving reliability of the third pulse power source 10C.

A pulse power source 10D (hereinafter referred to as "fourth pulse power source 10D") according to a fourth embodiment of the present invention will be described below with reference to FIGS. 20 through 28.

Figure 20:
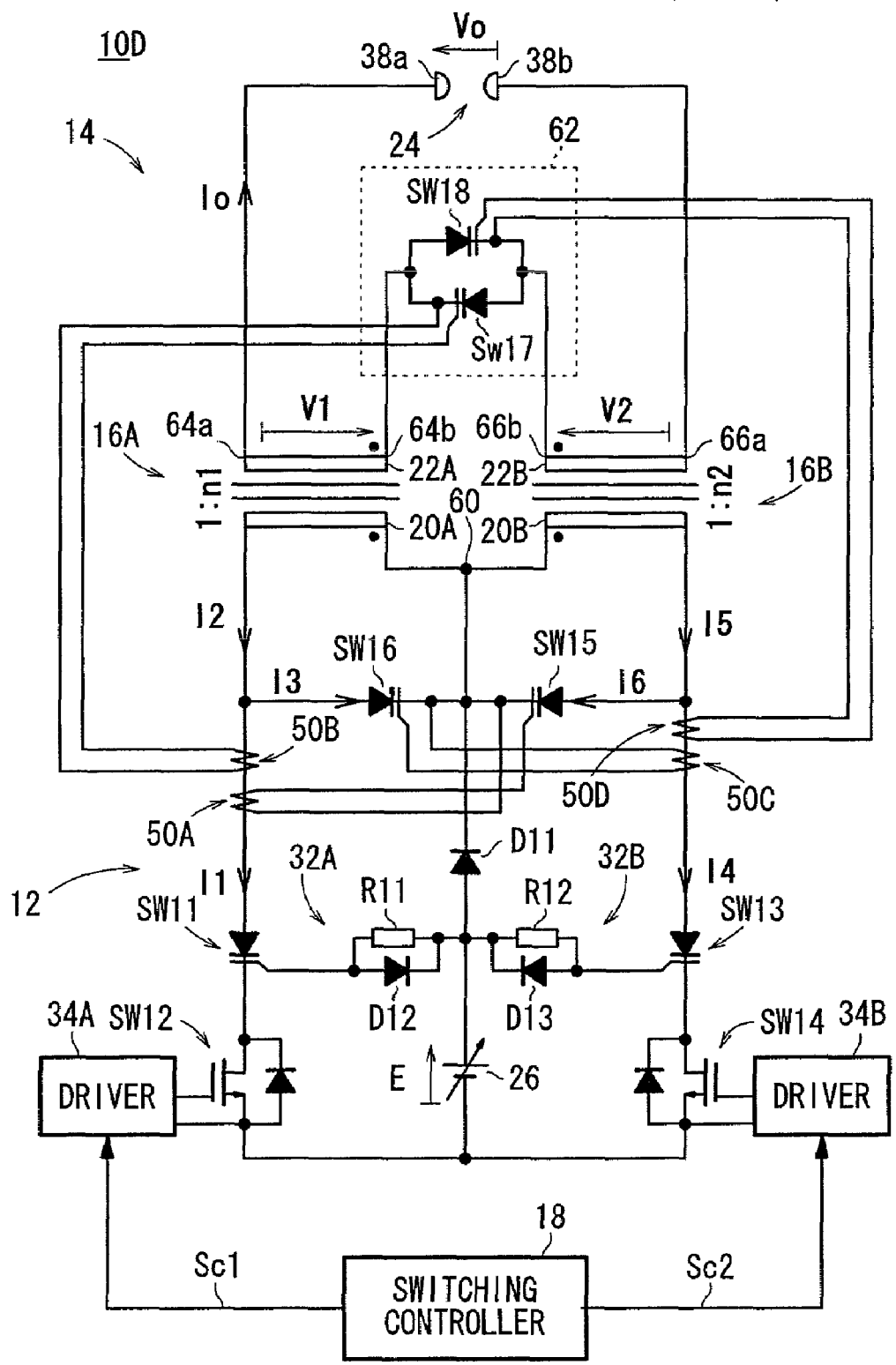
FIG. 20 is a circuit diagram of a pulse power source according to a fourth embodiment of the present invention, the pulse power source being in a mode 0 (initial state)

As shown in FIG. 20, the fourth pulse power source 10D is of essentially the same structure as the third pulse power source 10C described above. However, the fourth pulse power source 10D is different from the third pulse power source 10C as follows:

Two current transformers (a first current transformer 50A and a second current transformer 50B) are connected to the conductor of the first circuit 12 between the first primary winding 20A of the first transformer 16A and the anode terminal of the eleventh semiconductor switch SW11 in the first circuit 12. The output terminals of the first current transformer 50A are connected respectively to the gate and cathode terminals of the fifteenth semiconductor switch SW15, and the output terminals of the second current transformer 50B are connected respectively to the gate and cathode terminals of the seventeenth semiconductor switch SW17.

Similarly, two current transformers (a third current transformer 50C and a fourth current transformer 50D) are connected to the conductor of the first circuit 12 between the second primary winding 20B of the second transformer 16B and the anode terminal of the thirteenth semiconductor switch SW13. The output terminals of the third current transformer 50C are connected respectively to the gate and cathode terminals of the sixteenth semiconductor switch SW16, and the output terminals of the fourth current transformer 50D are connected respectively to the gate and cathode terminals of the eighteenth semiconductor switch SW18.

Circuit operation of the fourth pulse power source 10D will be described below with reference to circuit diagrams shown in FIGS. 20 through 26 and waveform diagrams shown in FIG. 27 and 28.

In a mode 0 (initial state) of the fourth pulse power source 10D, all the switches are turned off, as shown in FIG. 20.

Figure 27:
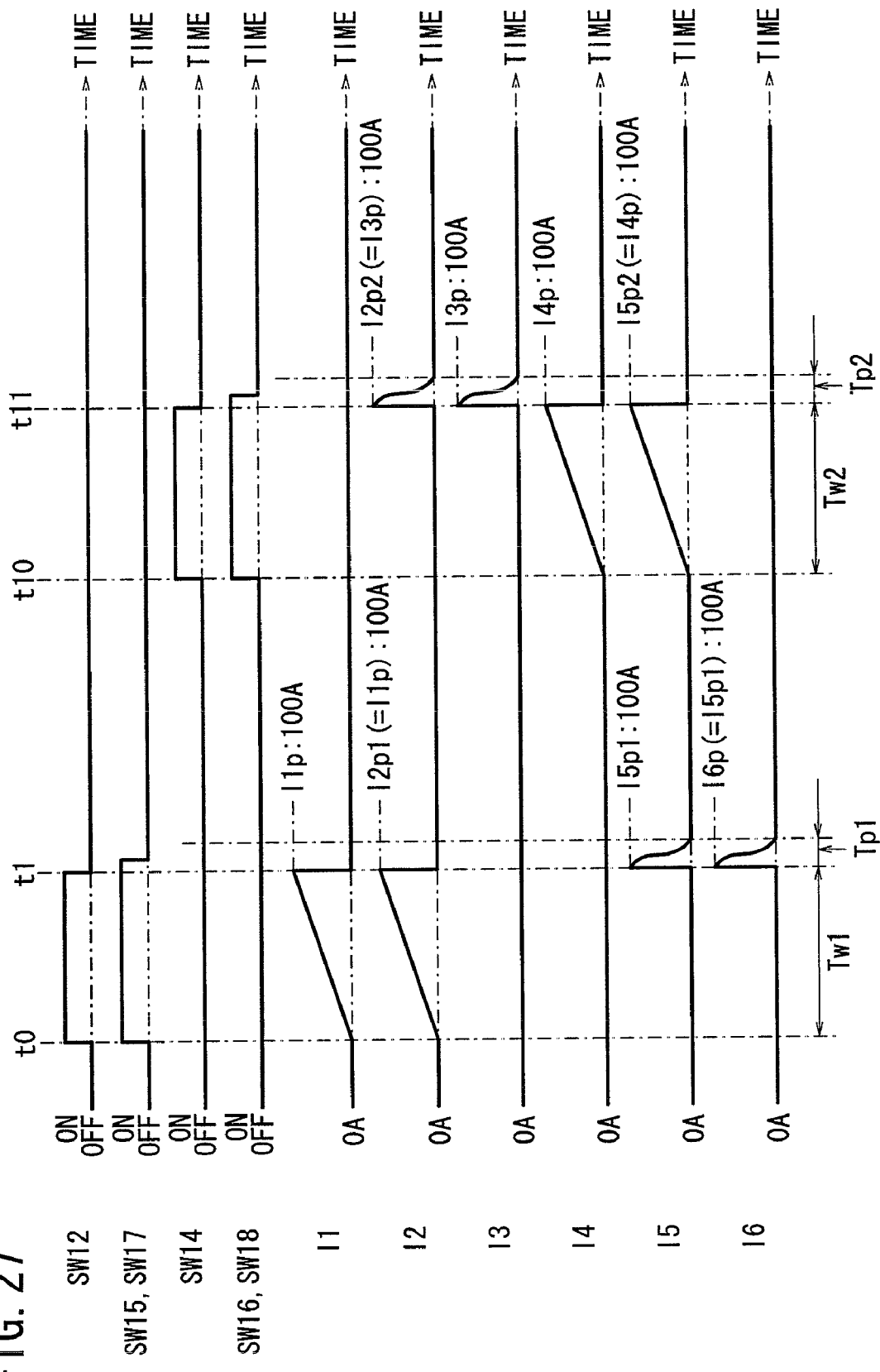
FIG. 27 is a diagram showing signal waveforms (part 1) in circuit operation of the pulse power source according to the fourth embodiment.
Figure 28:
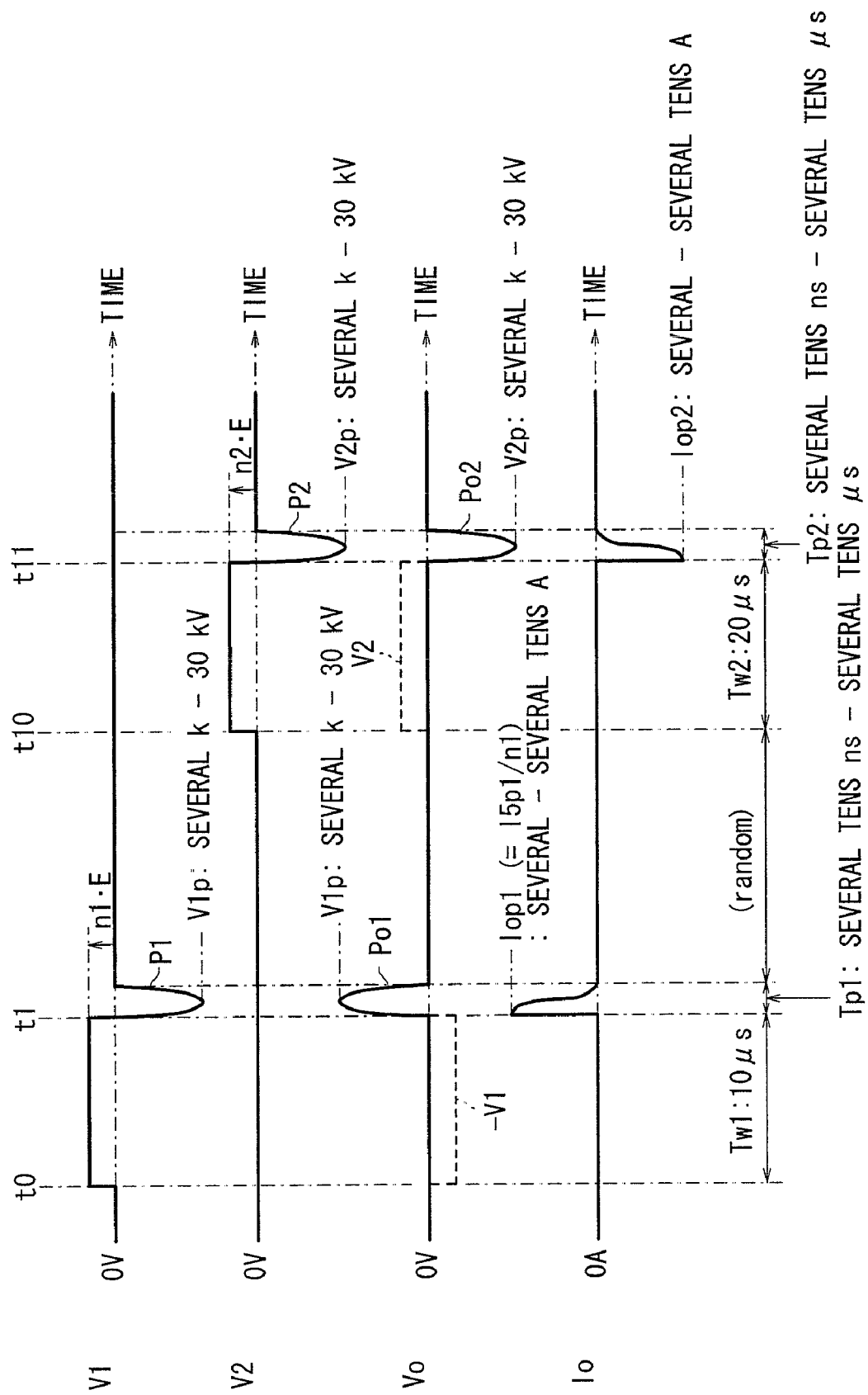
FIG. 28 is a diagram showing signal waveforms (part 2) in circuit operation of the pulse power source according to the fourth embodiment.
Figure 29:
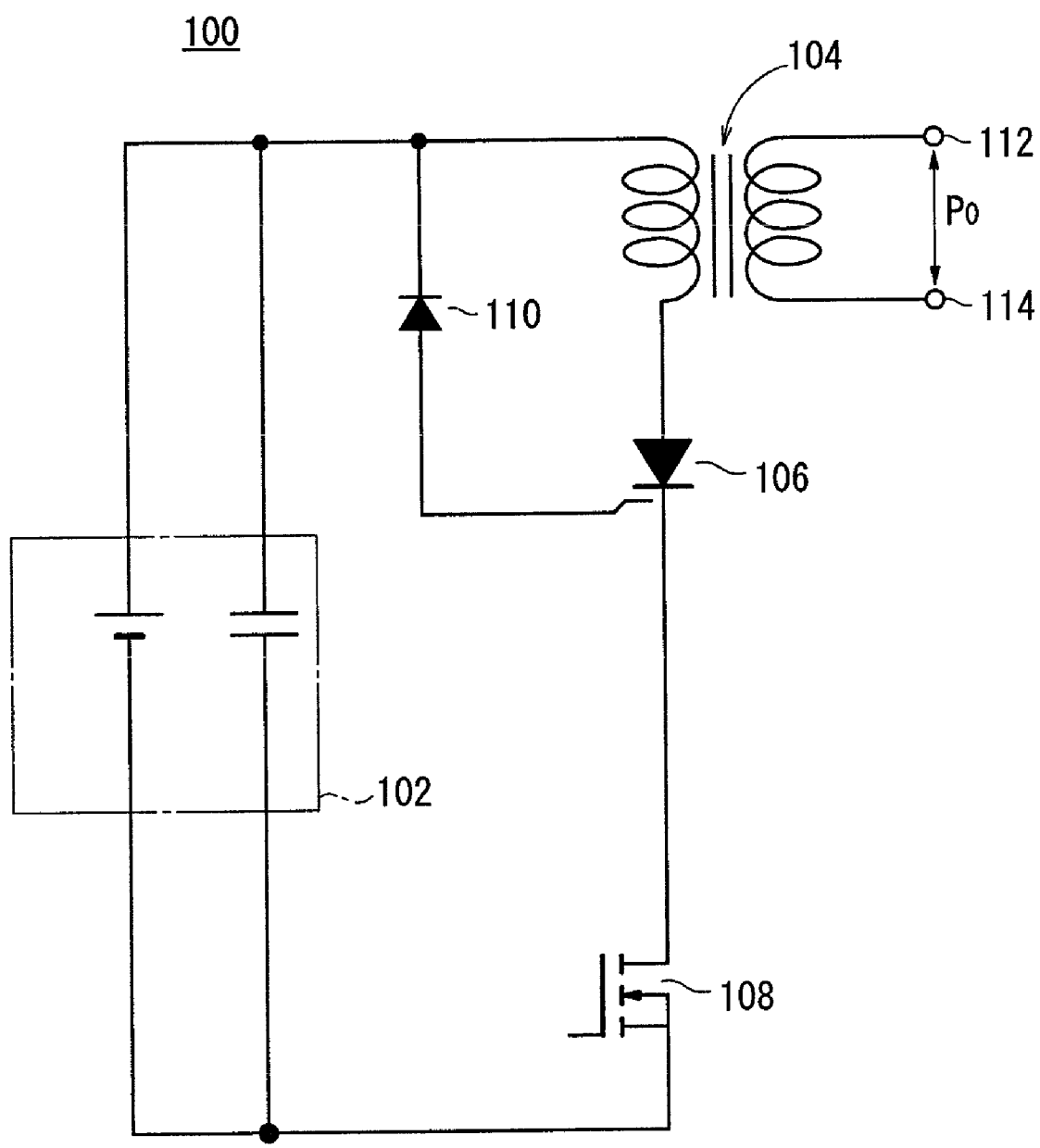
FIG. 29 is a circuit diagram of a conventional pulse power source.
Figure 30:
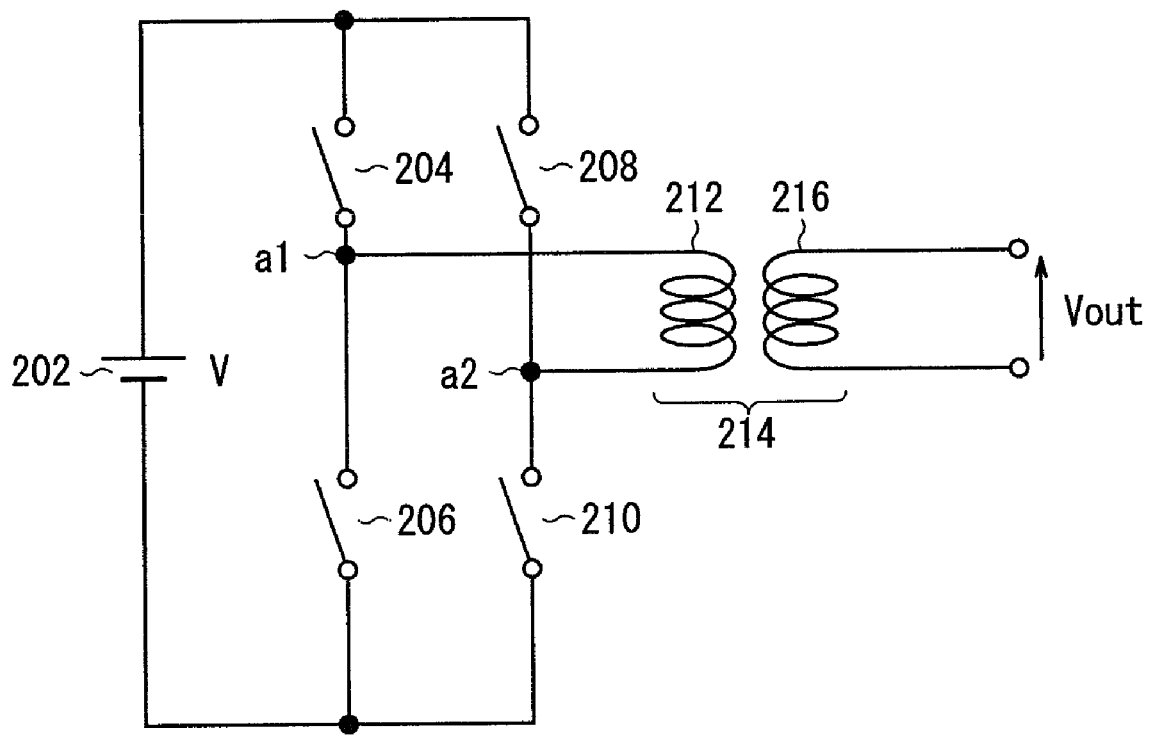
FIG. 30 is a circuit diagram of another conventional pulse power source.
Figure 31:
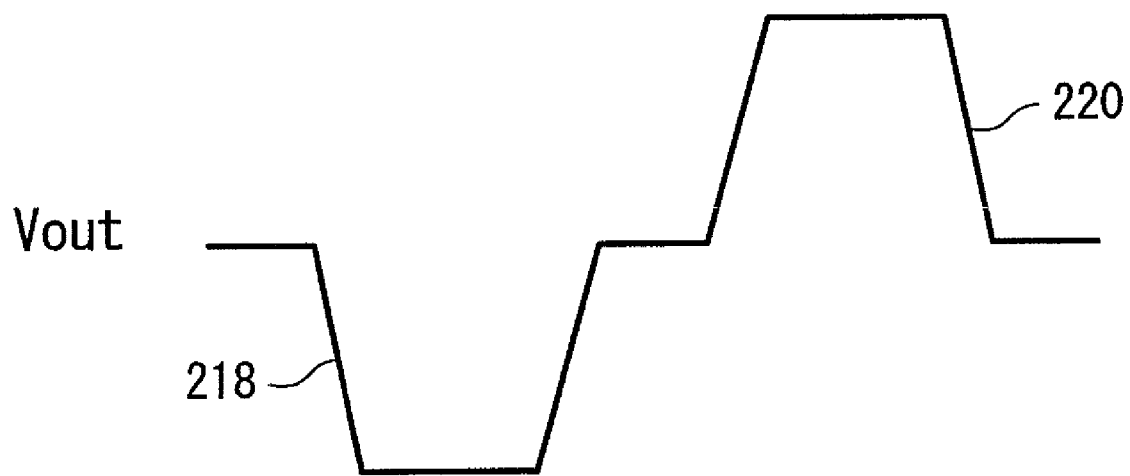
FIG. 31 is a diagram showing a pulse waveform output from still another conventional pulse power source.

Thereafter, at time t0 shown in FIG. 27, a high-level first switching control signal Sc1 is supplied between the gate and source terminals of the twelfth semiconductor switch SW12, turning on the twelfth semiconductor switch SW12.

Figure 21:
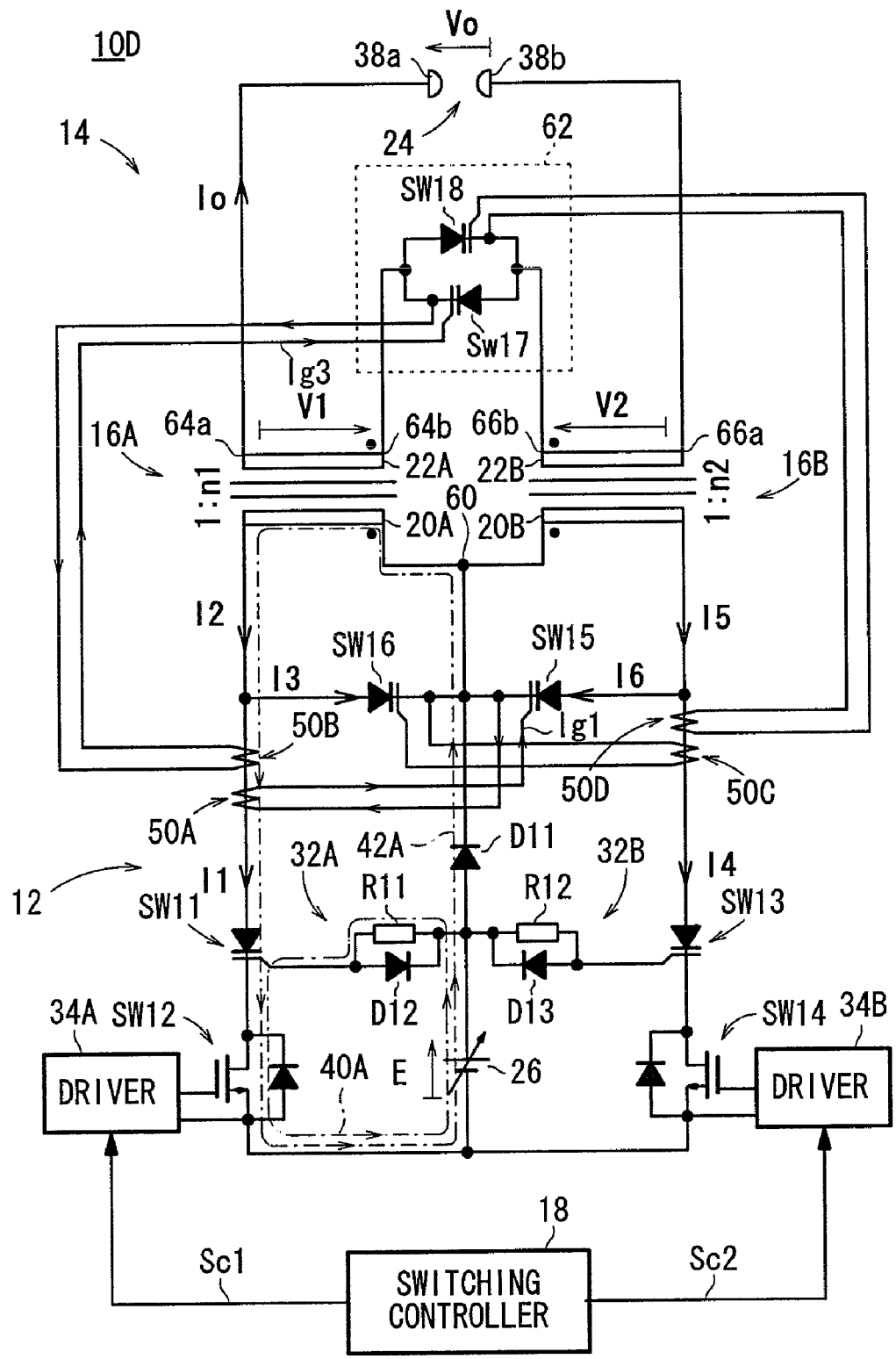
FIG. 21 is a circuit diagram of the pulse power source according to the fourth embodiment of the present invention, the pulse power source being in a mode 1 (charging period)

When the twelfth semiconductor switch SW12 is turned on at time t0, the fourth pulse power source 10D enters a mode 1 (charging period). In the mode 1, as shown in FIG. 21, a current flows along a path 40A from the DC power supply 26 to the eleventh resistor R11 to the gate terminal of the eleventh semiconductor switch SW11 to the cathode terminal of the eleventh semiconductor switch SW11 to the twelfth semiconductor switch SW12, turning on the eleventh semiconductor switch SW11. Now, the voltage E of the DC power supply 26 is applied across the first primary winding 20A of the first transformer 16A, causing a current I1 (=I2) to flow along a path 42A from the DC power supply 26 to the first primary winding 20A to the eleventh semiconductor switch SW11 to the twelfth semiconductor switch SW12 thereby to charge electromagnetic energy in the first primary winding 20A. During a period Tw1 in which the twelfth semiconductor switch SW12 is turned on, a constant positive voltage V1 is induced across the first secondary winding 22A.

When the current I1 flows, the first current transformer 50A and the second current transformer 50B supply a first gate current Ig1 and a third gate current Ig3, respectively, to the fifteenth semiconductor switch SW15 and the seventeenth semiconductor switch SW17, thereby turning on the fifteenth semiconductor switch SW15 and the seventeenth semiconductor switch SW17.

Since the seventeenth semiconductor switch SW17 is reverse-biased between the anode and cathode terminals thereof by the positive voltage V1 induced across the first secondary winding 22A, no current flows in the second circuit 14. In other words, since a negative voltage (−V1: the voltage indicated by the broken line as the voltage Vo in FIG. 28) based on the induced voltage V1 is prevented from being applied to the electrodes 38a, 38b of the load 24 by the seventeenth semiconductor switch SW17, no arc discharge is caused in the reactor which houses the electrodes 38a, 38b therein.

Because no current flows in the second circuit 14, no current flows along a path including the fifteenth semiconductor switch SW15, i.e., a path from the cathode terminal of the fifteenth semiconductor switch SW15 to the contact 60 to the second primary winding 20B to the anode terminal of the fifteenth semiconductor switch SW15.

Furthermore, since the sixteenth semiconductor switch SW16 is reverse-biased between the anode and cathode terminals thereof by the voltage E of the DC power supply 26, the sixteenth semiconductor switch SW16 is fully turned off and kept in that state.

Figure 22:
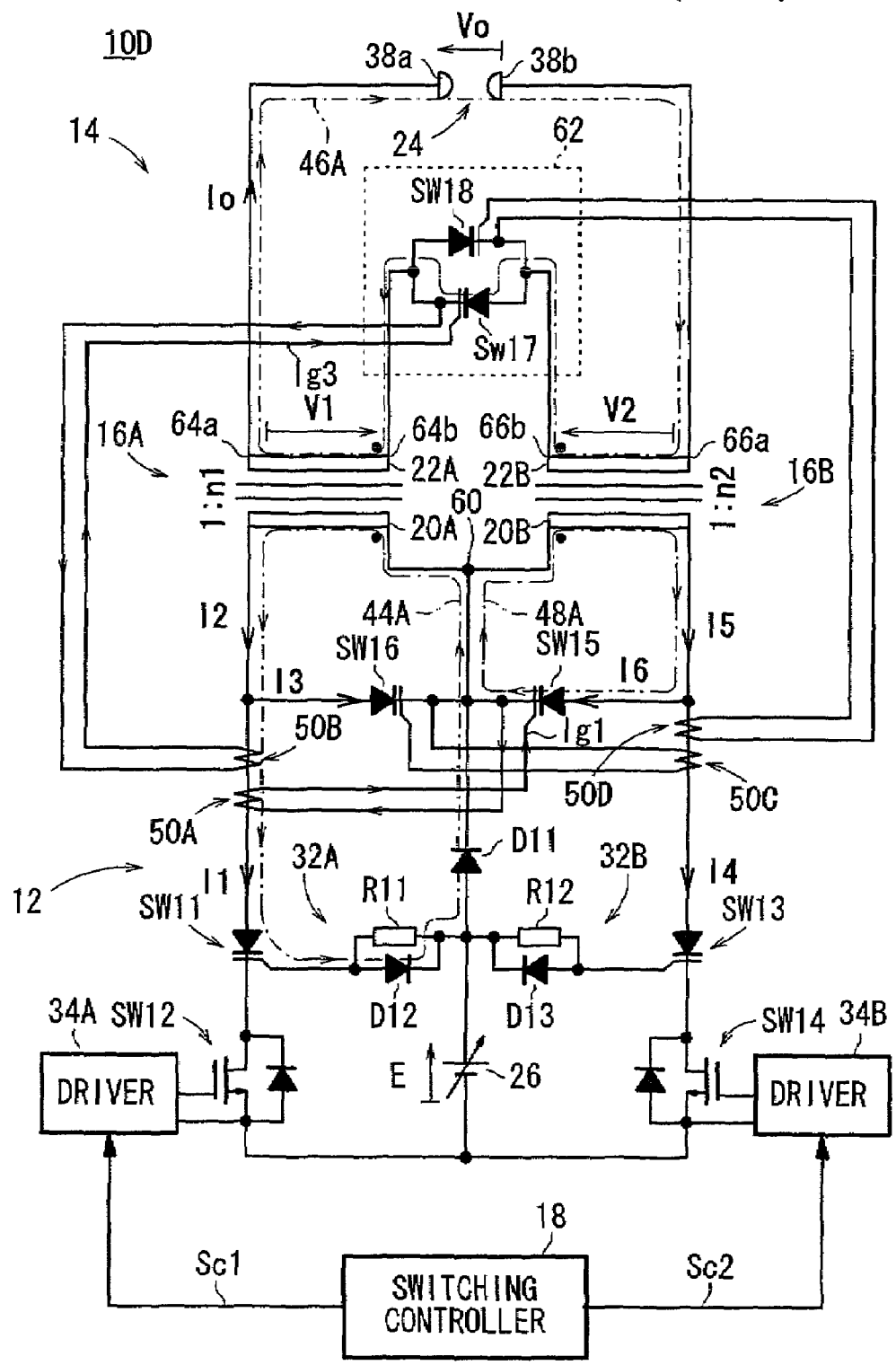
FIG. 22 is a circuit diagram of the pulse power source according to the fourth embodiment of the present invention, the pulse power source being in a mode 2 (commutation period)

When the twelfth semiconductor switch SW12 is turned off at time t1, the fourth pulse power source 10D enters a mode 2 (commutation period). As shown in FIG. 22, a current flows in the first circuit 12 along a path 44A from the first primary winding 20A to the eleventh semiconductor switch SW11 to the twelfth diode D12 to the eleventh diode D11, starting to turn off the eleventh semiconductor switch SW11. At the same time, a current Io starts to flow in the second circuit 14 due to the electromagnetic energy stored in the first primary winding 20A (see a path 46A). At this time, since a sufficient first gate current Ig1 and a sufficient third gate current Ig3 have flowed to the fifteenth semiconductor switch SW 15 and the seventeenth semiconductor switch SW17, a current I5 (=I6) flows along the path including the fifteenth semiconductor switch SW15, i.e., the path 48A from the cathode terminal of the fifteenth semiconductor switch SW15 to the contact 60 to the second primary winding 20B to the anode terminal of the fifteenth semiconductor switch SW15. At this time, since the sufficient first gate current Ig1 and the sufficient third gate current Ig3 have flowed to the fifteenth semiconductor switch SW15 and the seventeenth semiconductor switch SW17 to turn on the fifteenth semiconductor switch SW15 and the seventeenth semiconductor switch SW17 before the eleventh semiconductor switch SW11 is turned off, a sharply rising, large current Io flows with a low loss in the second circuit 14. Thereafter, the eleventh semiconductor switch SW11 is completely turned off.

Figure 23:
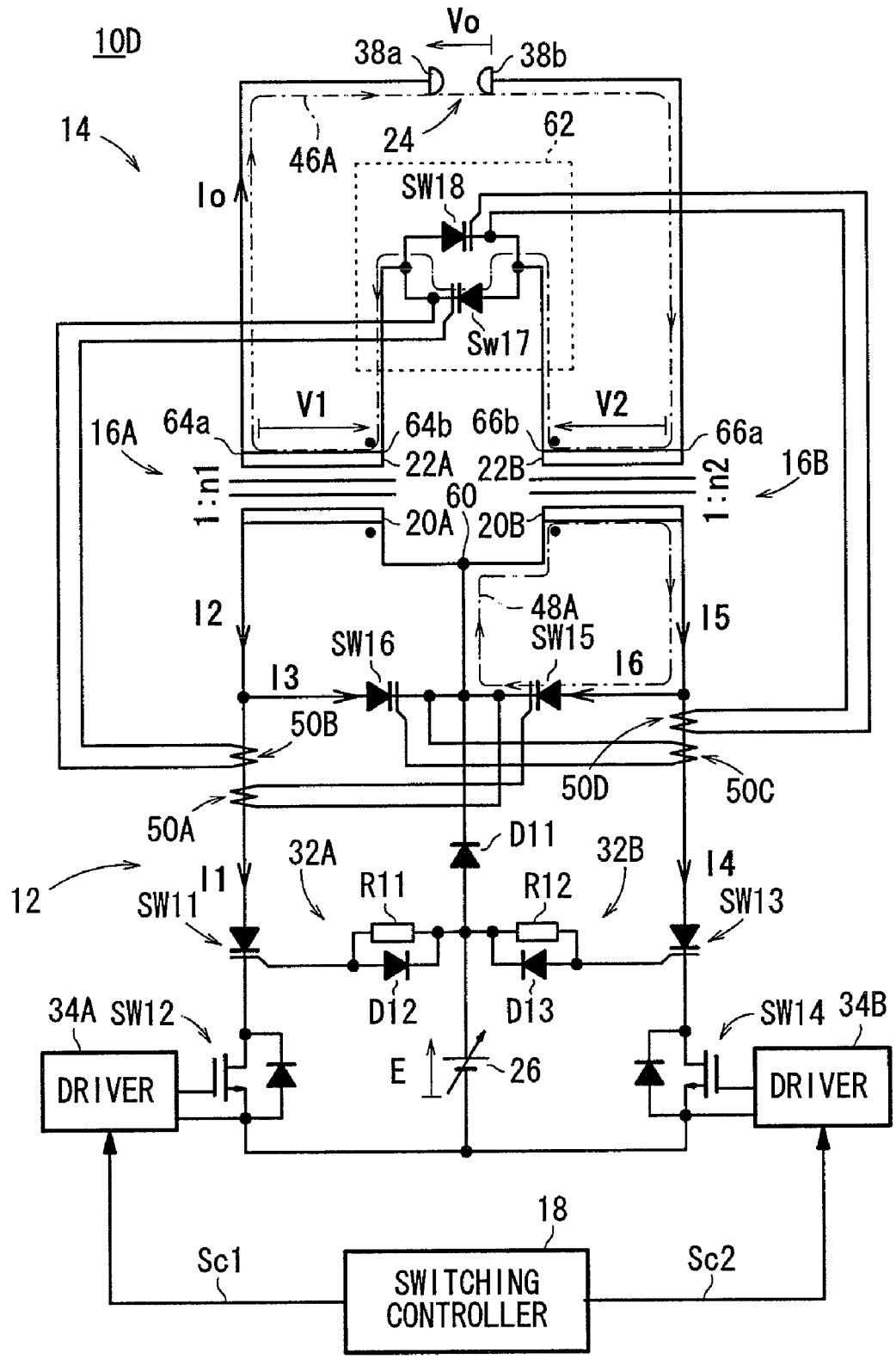
FIG. 23 is a circuit diagram of the pulse power source according to the fourth embodiment of the present invention, the pulse power source being in a mode 3 (discharging period)

When the eleventh semiconductor switch SW11 is completely turned off, the fourth pulse power source 10D enters a mode 3 (discharging period). As shown in FIG. 23, because of resonance between the exciting inductance and the capacitance between the electrodes 38a, 38b of the load 24, the output voltage Vo between the electrodes 38a, 38b increases, outputting a positive pulse Po1 having a positive voltage value (V1p) as its peak value (discharge starting voltage) (see FIG. 28), thereby reducing the output current Io. The gradient of the rising edge of the positive pulse Po1 is determined by the resonant frequency between the exciting inductance (Lex1) of the first transformer 16A and the capacitance of the load 24.

When the output voltage Vo reaches the discharge starting voltage V1p, the output voltage Vo quickly decreases. The output current Io decreases with a time constant determined by the characteristics of the load 24 during the discharge, and the fourth pulse power source 10D enters the mode 0 (initial stage) shown in FIG. 20 again.

The positive pulse Po1 has a pulse duration Tp1 determined by the resonance between the exciting inductance and the capacitance between the electrodes 38a, 38b of the load 24, and the characteristics of the load 24 during the discharge. The pulse duration Tp1 increases, as the resonant frequency is lower.

Thereafter, at time t10 shown in FIG. 27, a high-level switching control signal Sc2 is supplied between the gate and source terminals of the fourteenth semiconductor switch SW14, turning on the fourteenth semiconductor switch SW14.

Figure 24:
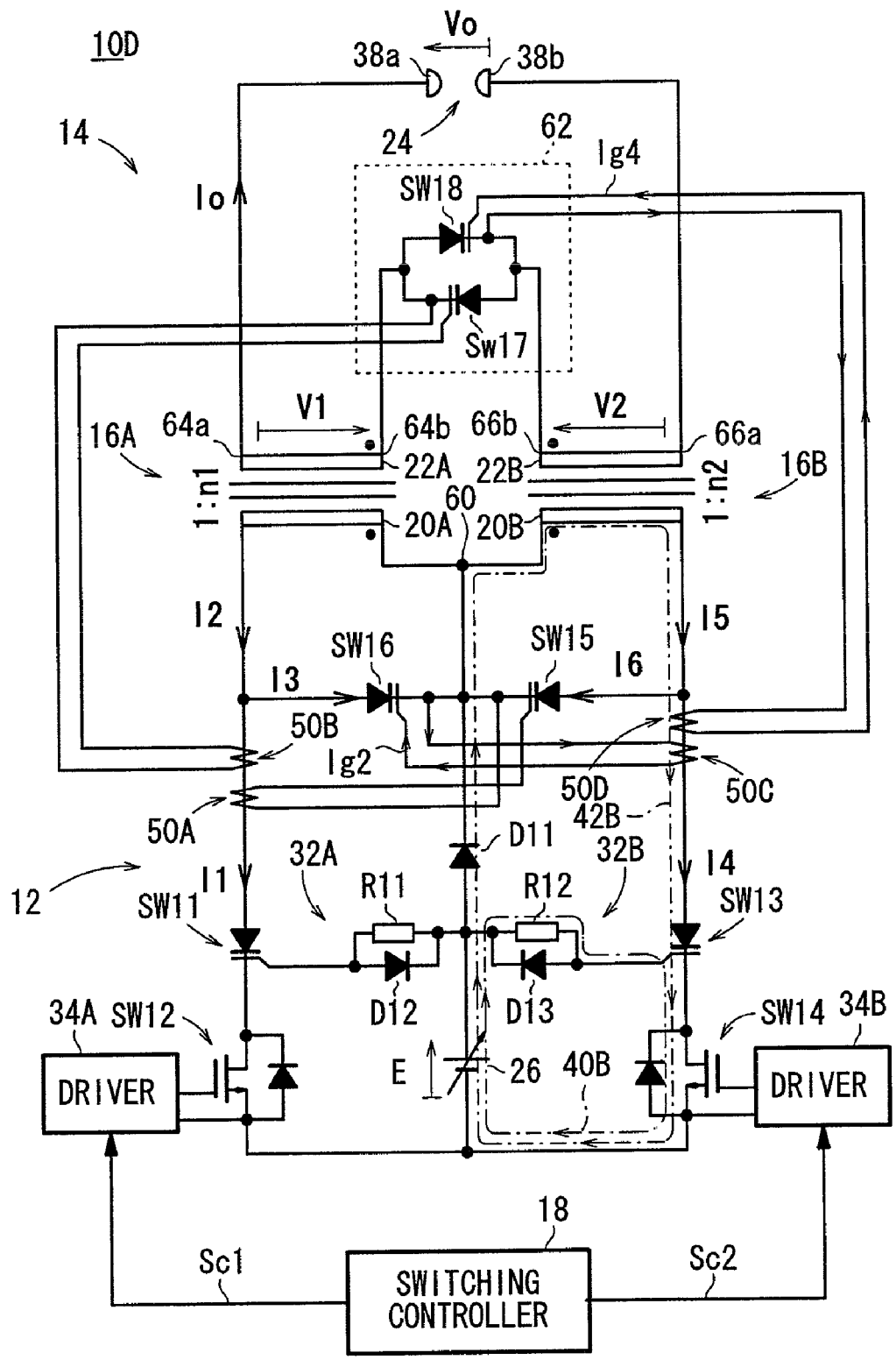
FIG. 24 is a circuit diagram of the pulse power source according to the fourth embodiment of the present invention, the pulse power source being in a mode 4 (charging period)

When the fourteenth semiconductor switch SW14 is turned on at time t10, the fourth pulse power source 10D enters a mode 4 (charging period). In the mode 4, as shown in FIG. 24, a current flows along a path 40B from the DC power supply 26 to the twelfth resistor R12 to the gate terminal of the thirteenth semiconductor switch SW13 to the cathode terminal of the thirteenth semiconductor switch SW13 to the fourteenth semiconductor switch SW14, turning on the thirteenth semiconductor switch SW13. Now, the voltage E of the DC power supply 26 is applied across the second primary winding 20B of the second transformer 16B, causing a current I4 (=I5) to flow along a path 42B from the DC power supply 26 to the second primary winding 20B to the thirteenth semiconductor switch SW13 to the fourteenth semiconductor switch SW14 thereby to charge electromagnetic energy in the second primary winding 20B. During a period Tw2 in which the fourteenth semiconductor switch SW14 is turned on, a constant positive voltage V2 is induced across the second secondary winding 22B (see FIG. 28).

When the current I4 flows, the third current transformer 50C and the fourth current transformer 50D supply a second gate current Ig2 and a fourth gate current Ig4, respectively, to the sixteenth semiconductor switch SW16 and the eighteenth semiconductor switch SW18, thereby turning on the sixteenth semiconductor switch SW16 and the eighteenth semiconductor switch SW18.

Since the eighteenth semiconductor switch SW18 is reverse-biased between the anode and cathode terminals thereof by the positive voltage V2 induced across the second secondary winding 22B, no current flows in the second circuit 14. In other words, as the positive voltage V2 is prevented from being applied to the electrodes 38a, 38b of the load 24 by the eighteenth semiconductor switch SW18, no arc discharge is caused in the reactor which houses the electrodes 38a, 38b therein.

Because no current flows in the second circuit 14, no current flows along a path including the sixteenth semiconductor switch SW16, i.e., a path from the cathode terminal of the sixteenth semiconductor switch SW16 to the contact 60 to the first primary winding 20A to the anode terminal of the sixteenth semiconductor switch SW16.

Furthermore, as the fifteenth semiconductor switch SW15 is reverse-biased between the anode and cathode terminals thereof by the voltage E of the DC power supply 26, the fifteenth semiconductor switch SW15 is fully turned off and kept in that state.

Figure 25:
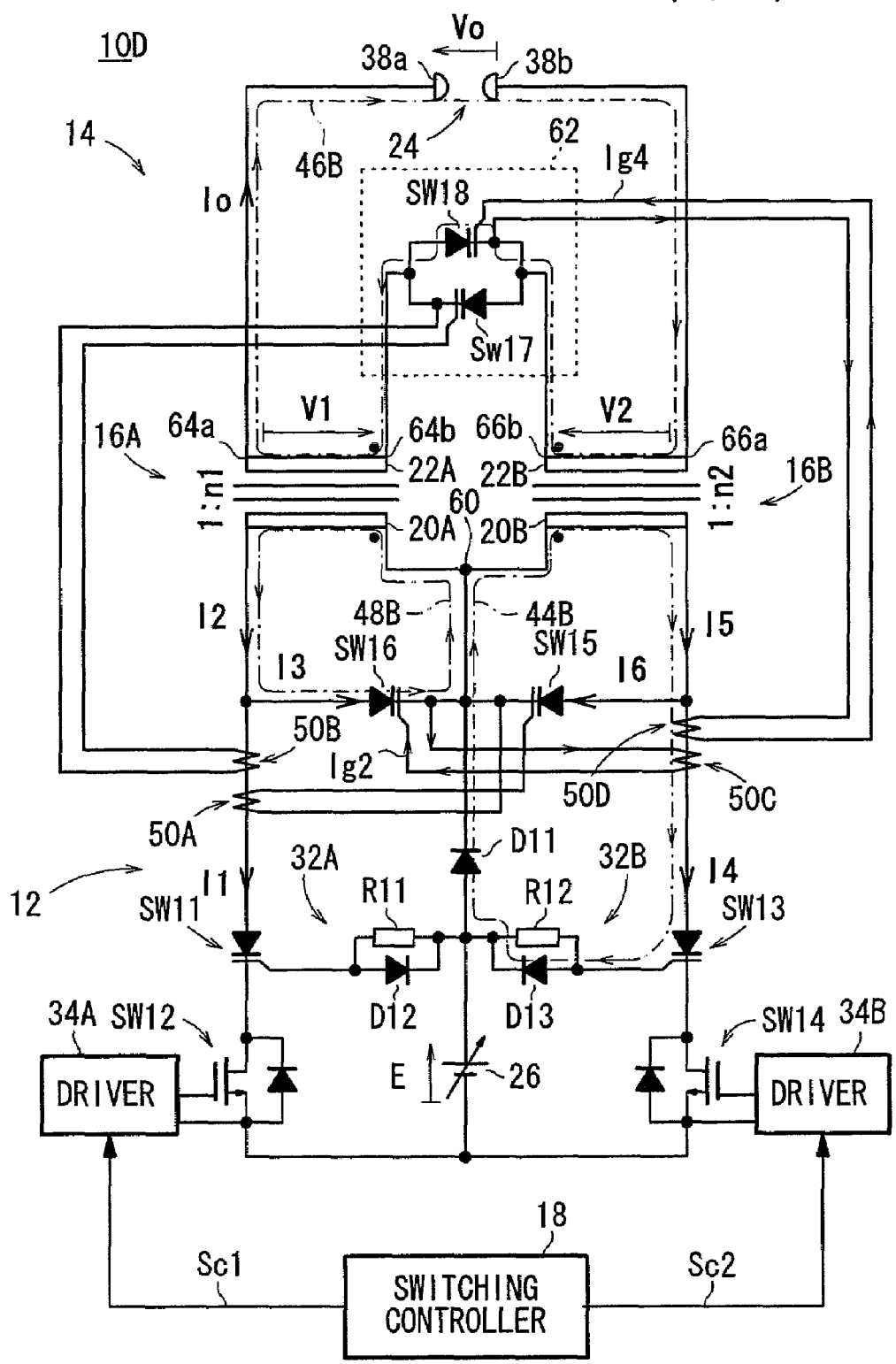
FIG. 25 is a circuit diagram of the pulse power source according to the fourth embodiment of the present invention, the pulse power source being in a mode 5 (commutation period)

When the fourteenth semiconductor switch SW14 is turned off at time t11, the fourth pulse power source 10D enters a mode 5 (commutation period). As shown in FIG. 25, a current flows in the first circuit 12 along a path 44B from the second primary winding 20B to the thirteenth semiconductor switch SW13 to the thirteenth diode D13 to the eleventh diode D11, starting to turn off the thirteenth semiconductor switch SW13. At the same time, a current starts to flow in the second circuit 14 due to the electromagnetic energy charged in the second primary winding 20B (see a path 46B). At this time, since a sufficient second gate current Ig2 and a sufficient fourth gate current Ig4 have flowed to the sixteenth semiconductor switch SW16 and the eighteenth semiconductor switch SW18, a current I2 (=I3) flows along the path including the sixteenth semiconductor switch SW16, i.e., the path 48B from the cathode terminal of the sixteenth semiconductor switch SW16 to the contact 60 to the first primary winding 20A to the anode terminal of the sixteenth semiconductor switch SW16.

At this time, since the sufficient second gate current Ig2 and the sufficient fourth gate current Ig4 have flowed to the sixteenth semiconductor switch SW16 and the eighteenth semiconductor switch SW18 to turn on the sixteenth semiconductor switch SW16 and the eighteenth semiconductor switch SW18 before the thirteenth semiconductor switch SW13 is turned off, a sharply rising, large current Io flows with a low loss in the second circuit 14. Thereafter, the thirteenth semiconductor switch SW13 is completely turned off.

Figure 26:
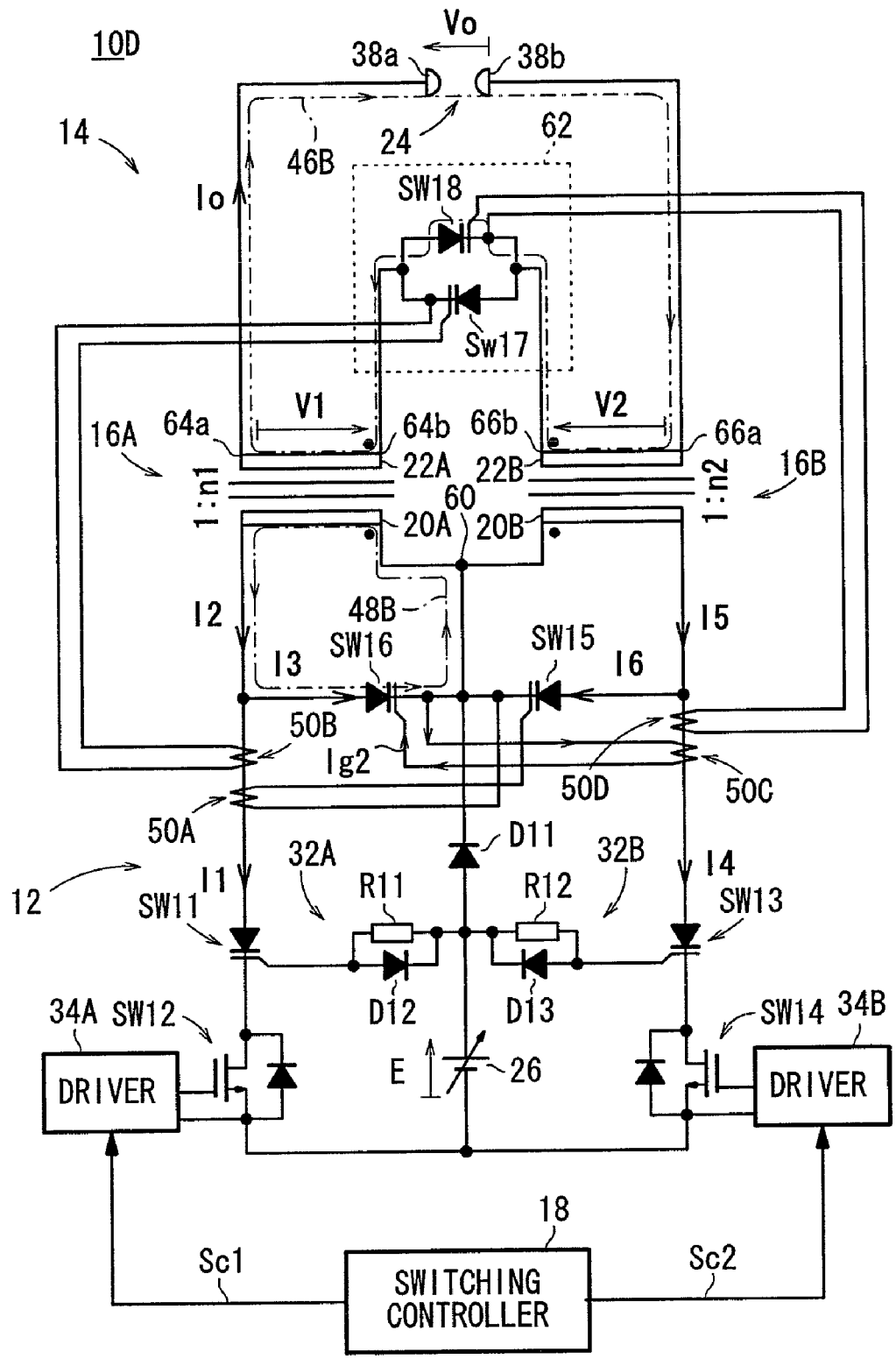
FIG. 26 is a circuit diagram of the pulse power source according to the fourth embodiment of the present invention, the pulse power source being in a mode 6 (discharging period)

When the thirteenth semiconductor switch SW13 is completely turned off, the fourth pulse power source 10D enters a mode 6 (discharging period). As shown in FIG. 26, because of resonance between the exciting inductance and the capacitance between the electrodes 38a, 38b of the load 24, the absolute value of the output voltage Vo between the electrodes 38a, 38b increases, outputting a negative pulse Po2 having a negative voltage value (V2p) as its peak value (discharge starting voltage) (see FIG. 28), thereby reducing the output current Io. The gradient of the rising edge of the negative pulse Po2 is determined by the resonant frequency between the exciting inductance (Lex2) of the second transformer 16B and the capacitance of the load 24.

When the output voltage Vo reaches the discharge starting voltage V2p, the absolute value of the output voltage Vo quickly decreases. The output current Io decreases with a time constant determined by the characteristics of the load 24 upon the discharge, and the fourth pulse power source 10D enters the mode 0 (initial stage) shown in FIG. 20 again.

The negative pulse Po2 has a pulse duration Tp2 determined by the resonance between the exciting inductance and the capacitance between the electrodes 38a, 38b of the load 24, and the characteristics of the load 24 during the discharge. The pulse duration Tp2 increases, as the resonant frequency is lower.

As with the third pulse power source 10C described above, the fourth pulse power source 10D can successively generate positive high-voltage pulses Po1 and negative high-voltage pulses Po2, with the pulse duration Tp1 of the positive pulses Po1 and the pulse duration Tp2 of the negative pulses Po2 being independently variable.

When a current is commutated from the first circuit 12 to the second circuit 14, a sharply rising, large current Io flows with a low loss in the second circuit 14. The voltage V1 induced across the first secondary winding 22A and the voltage V2 induced across the second secondary winding 22B are prevented from being applied to the electrodes 38a, 38b during the charging periods Tw1, Tw2 in the first circuit 12. Therefore, the fourth pulse power source 10D has increased reliability.

Particularly, the fourth pulse power source 10D is simple in circuit arrangement, low in cost, and small in size because the turn-on of the fifteenth through eighteenth semiconductor switches SW15 through 18 can be controlled simply by connecting the first through fourth current transformers 50A through 50D to the first circuit 12.

Although certain preferred embodiments of the present invention have been shown and described in detail, it should be understood that various changes and modifications may be made therein without departing from the scope of the appended claims.

What is claimed is:

1. An electric circuit comprising:
   a first circuit having a first semiconductor switch; and
   a second circuit for commutating a current based on turn-off of said first semiconductor switch;
   said second circuit having a second semiconductor switch which is turned on while being reverse-biased during at least a final stage of a period in which said first semiconductor switch is turned on,
   wherein said first circuit is connected between a primary winding terminal of a transformer and a DC power supply, and said second circuit is connected between a secondary winding terminal of said transformer and a load.

2. An electric circuit according to claim 1, wherein said second semiconductor switch has a gate terminal, a cathode terminal, and an anode terminal, said electric circuit further comprising:
   a control circuit for supplying at least an On signal between said gate terminal and said cathode terminal of said second semiconductor switch during at least the final stage of the period in which said first semiconductor switch is turned on.

3. An electric circuit according to claim 1, wherein said second semiconductor switch has a gate terminal, a cathode terminal, and an anode terminal, said electric circuit further comprising:
   a third circuit for supplying a current flowing in said first circuit as an On signal between said gate terminal and said cathode terminal of said second semiconductor switch.

4. A pulse power source comprising:
   a first circuit having a first semiconductor switch; and
   a second circuit for commutating a current based on turn-off of said first semiconductor switch and generating a high-voltage pulse;
   said second circuit having a second semiconductor switch which is turned on while being reverse-biased during at least a final stage of a period in which said first semiconductor switch is turned on,
   wherein said first circuit is connected between a primary winding terminal of a transformer and a DC power supply, and said second circuit is connected between a secondary winding terminal of said transformer and a load.

5. A pulse power source according to claim 4, wherein said second semiconductor switch has a gate terminal, a cathode terminal, and an anode terminal, said pulse power source further comprising:
   a control circuit for supplying at least an On signal between said gate terminal and said cathode terminal of said second semiconductor switch during at least the final stage of the period in which said first semiconductor switch is turned on.

6. A pulse power source according to claim 4, wherein said second semiconductor switch has a gate terminal, a cathode terminal, and an anode terminal, said pulse power source further comprising:
- a third circuit for supplying a current flowing in said first circuit as an On signal between said gate terminal and said cathode terminal of said second semiconductor switch.

7. A pulse power source according to claim 4, wherein said first circuit and said second circuit are coupled to each other by said transformer; and
- said second semiconductor switch is connected in series with said secondary winding in such a direction that a voltage generated in said second circuit is reverse-biased during a period in which said first semiconductor switch is turned on.

8. A pulse power source for storing a first induced energy in a first inductor, generating a first pulse when said first induced energy is released from said first inductor, storing a second induced energy in a second inductor, and generating a second pulse opposite to said first pulse when said second induced energy is released from said second inductor, comprising:
- a DC power supply;
- a rectifier connected between a contact between a primary winding of said first inductor and a primary winding of said second inductor and said DC power supply, for supplying a current to said contact;
- a first switch circuit for controlling the current from said rectifier to flow from said contact to said first inductor;
- a second switch circuit for controlling the current from said rectifier to flow from said contact to said second inductor;
- a semiconductor switch which is turned on while being in a zero-current state during at least a final stage of a period for storing said first induced energy in said first inductor; and
- another semiconductor switch which is turned on while being in a zero-current state during at least a final stage of a period for storing said second induced energy in said second inductor.

9. A pulse power source according to claim 8, wherein said first switch circuit comprises:
- a first semiconductor switch connected between said first inductor and said DC power supply, for supplying a current from said DC power supply, from said contact to said first inductor;
- a second semiconductor switch for controlling turn-on/off of said first semiconductor switch; and
- a first control circuit for controlling turn-on/off of said second semiconductor switch; and wherein said second switch circuit comprises:
- a third semiconductor switch connected between said second inductor and said DC power supply, for supplying a current from said DC power supply, from said contact to said second inductor;
- a fourth semiconductor switch for controlling turn-on/off of said third semiconductor switch; and
- a second control circuit for controlling turn-on/off of said fourth semiconductor switch.

10. A pulse power source according to claim 8, wherein each of said semiconductor switch and said another semiconductor switch has a gate terminal, a cathode terminal, and an anode terminal, said pulse power source further comprising:
- a third control circuit for supplying at least an On signal between said gate terminal and said cathode terminal of said semiconductor switch during at least the final stage of the period for storing said first induced energy in said first inductor; and
- a fourth control circuit for supplying at least an On signal between said gate terminal and said cathode terminal of said another semiconductor switch during at least the final stage of the period for storing said second induced energy in said second inductor.

11. A pulse power source according to claim 8, wherein each of said semiconductor switch and said another semiconductor switch has a gate terminal, a cathode terminal, and an anode terminal, said pulse power source further comprising:
- a first circuit for supplying a current flowing in said first inductor as an On signal between said gate terminal and said cathode terminal of said semiconductor switch; and
- a second circuit for supplying a current flowing in said second inductor as an On signal between said gate terminal and said cathode terminal of said another semiconductor switch.

12. A pulse power source for storing a first induced energy in a first inductor, generating a first pulse when said first induced energy is released from said first inductor, storing a second induced energy in a second inductor, and generating a second pulse opposite to said first pulse when said second induced energy is released from said second inductor, comprising:
- a DC power supply;
- a rectifier connected between a contact between a primary winding of said first inductor and a primary winding of said second inductor and said DC power supply, for supplying a current to said contact;
- a first switch circuit for controlling the current from said rectifier to flow from said contact to said first inductor;
- a second switch circuit for controlling the current from said rectifier to flow from said contact to said second inductor;
- a semiconductor switch which is turned on while being reverse-biased by a voltage generated across a secondary winding of said first inductor during at least a final stage of a period for storing said first induced energy in said first inductor; and
- another semiconductor switch which is turned on while being reverse-biased by a voltage generated across a secondary winding of said second inductor during at least a final stage of a period for storing said second induced energy in said second inductor.

13. A pulse power source according to claim 12, wherein said first switch circuit comprises:
- a first semiconductor switch connected between said first inductor and said DC power supply, for supplying a current from said DC power supply, from said contact to said first inductor;
- a second semiconductor switch for controlling turn-on/off of said first semiconductor switch; and
- a first control circuit for controlling turn-on/off of said second semiconductor switch; and wherein said second switch circuit comprises:
- a third semiconductor switch connected between said second inductor and said DC power supply, for supplying a current from said DC power supply, from said contact to said second inductor;
- a fourth semiconductor switch for controlling turn-on/off of said third semiconductor switch; and
- a second control circuit for controlling turn-on/off of said fourth semiconductor switch.

14. A pulse power source according to claim 12, wherein each of said semiconductor switch and said another semiconductor switch has a gate terminal, a cathode terminal, and an anode terminal, said pulse power source further comprising:

a control circuit for supplying an On signal between said gate terminal and said cathode terminal of said semiconductor switch during at least the final stage of the period for storing said first induced energy in said first inductor; and another control circuit for supplying an On signal between said gate terminal and said cathode terminal of said another semiconductor switch during at least the final stage of the period for storing said second induced energy in said second inductor.

15. A pulse power source according to claim 12, wherein each of said semiconductor switch and said another semiconductor switch has a gate terminal, a cathode terminal, and an anode terminal, said pulse power source further comprising:

a third circuit for supplying a current flowing in the primary winding of said first inductor as an On signal between said gate terminal and said cathode terminal of said semiconductor switch; and a fourth circuit for supplying a current flowing in the primary winding of said second inductor as an On signal between said gate terminal and said cathode terminal of said another semiconductor switch.

* * * * *